(12) United States Patent
Yun et al.

(10) Patent No.: US 10,899,908 B2
(45) Date of Patent: Jan. 26, 2021

(54) SELF-HEALING COMPOSITE AND DEVICE INCLUDING SELF-HEALING FILM

(71) Applicants: Samsung Electronics Co., Ltd., Suwon-si (KR); THE BOARD OF TRUSTEES OF THE LELAND STANFORD JUNIOR UNIVERSITY, Stanford, CA (US)

(72) Inventors: Youngjun Yun, Yongin-si (KR); Donghee Son, Stanford, CA (US); Jiheong Kang, Stanford, CA (US); Zhenan Bao, Stanford, CA (US); Orestis Vardoulis, Stanford, CA (US)

(73) Assignees: Samsung Electronics Co., Ltd., Gyeonggi-do (KR); The Roam Of Trustees Of The Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/458,429

(22) Filed: Jul. 1, 2019

(65) Prior Publication Data
US 2020/0002501 A1    Jan. 2, 2020

Related U.S. Application Data

(60) Provisional application No. 62/691,786, filed on Jun. 29, 2018.

(51) Int. Cl.
*C08K 3/00* (2018.01)
*H01B 1/24* (2006.01)
(Continued)

(52) U.S. Cl.
CPC .............. *C08K 3/041* (2017.05); *C08K 3/08* (2013.01); *H01B 1/24* (2013.01); *H01L 51/0034* (2013.01);
(Continued)

(58) Field of Classification Search
CPC ... H01B 1/00; H01B 1/22; H01B 1/24; C09D 5/24; B05D 5/12
See application file for complete search history.

(56) References Cited

U.S. PATENT DOCUMENTS 6,783,709 B2 *   8/2004   Harreld .............. C08G 77/452
                                                      264/36.1
7,612,152 B2 *  11/2009   Braun .................. B29C 73/163
                                                      523/211
(Continued)

FOREIGN PATENT DOCUMENTS

EP          2829561 A1     1/2015
JP        2009-232678 A    10/2009
(Continued)

OTHER PUBLICATIONS

Guo et al "Conductive elastomers with autonomic selh-healing properties", Angew. Chem. Int. Ed. 2015, 54, 12127-12133.*
(Continued)

*Primary Examiner* — Mark Kopec
(74) *Attorney, Agent, or Firm* — Harness, Dickey & Pierce, P.L.C.

(57) ABSTRACT

A self-healing composite includes a matrix including an elastomer and conductive nanostructures embedded in the matrix, wherein the elastomer includes a polymer main chain, a —HN—C(=O)—NH— containing first structural unit capable of forming a strong hydrogen bond, and a —HN—C(=O)—NH— containing second structural unit capable of forming a weak hydrogen bond.

23 Claims, 20 Drawing Sheets

(51) Int. Cl.
*C08K 3/04* (2006.01)
*H01L 51/00* (2006.01)
*C08K 3/08* (2006.01)
*H01L 51/05* (2006.01)
*H01L 51/10* (2006.01)
*H01L 51/50* (2006.01)
*H01L 51/52* (2006.01)

(52) U.S. Cl.
CPC .. *H01L 51/0048* (2013.01); *C08K 2003/0806* (2013.01); *C08K 2201/001* (2013.01); *C08K 2201/011* (2013.01); *H01L 51/0003* (2013.01); *H01L 51/0021* (2013.01); *H01L 51/0545* (2013.01); *H01L 51/105* (2013.01); *H01L 51/5012* (2013.01); *H01L 51/5206* (2013.01); *H01L 51/5221* (2013.01); *H01L 2251/5369* (2013.01)

(56) References Cited

U.S. PATENT DOCUMENTS

| | | |
|---|---|---|
| 8,675,167 B2 | 3/2014 | Jang et al. |
| 9,185,798 B2 | 11/2015 | Young et al. |
| 2008/0280137 A1 | 11/2008 | Ajayan et al. |
| 2009/0099291 A1 | 4/2009 | Jia et al. |
| 2009/0247694 A1* | 10/2009 | Kritzer ................. B29C 73/163 524/556 |
| 2017/0044190 A1 | 2/2017 | Sjong et al. |
| 2019/0106544 A1* | 4/2019 | Bao .......................... B29C 73/16 |
| 2019/0345334 A1* | 11/2019 | Saito ................... C08G 77/388 |

FOREIGN PATENT DOCUMENTS

| | | |
|---|---|---|
| JP | 5145564 B2 | 2/2013 |
| KR | 10-1578907 | 12/2015 |
| KR | 10-1584663 | 1/2016 |

OTHER PUBLICATIONS

Zhang et al "Heterogeneity, segmental and hydrogen bond dynamics, and aging of supramolecular self-healing rubber", Macromolecules 2013, 46, 1841-1850.*

Okafor et al "Thermomechanical and corrosion inhibition properties of graphene/epoxy ester-siloxane-urea hybrid polymer nanoconnposites", Progress in Organic Coatings 88 (2015) 237-244.*

J. Sun et al. "Highly Stretchable and Tough Hydrogels" Macmillan Publishers Limited, vol. 489, Sep. 6, 2012, pp. 133-136.

T. Sun et al. "Physical Hydrogels Composed of Polyampholytes Demonstrate High Toughness and Viscoelasticity" Macmillan Publishers Limited, Nature Materials, vol. 12, Oct. 2013, p. 932-937.

C. Li et al. "A Highly Stretchable Autonomous Self-Healing Elastomer" Nature Chemistry, vol. 8, Jun. 2016, pp. 618-624.

E. Ducrot et al. "Toughening Elastomers With Sacrificial Bonds and Watching Them Break" Science, vol. 344, Apr. 11, 2014, pp. 186-189.

J. Neal et al. "Enhancing Mechanical Performance of a Covalent Self-Healing Material by Sacrificial Noncovalent Bonds" Journal of the American Chemical Society, 2015, 137, pp. 4846-4850.

W. Yang et al. "On the Tear Resistance of Skin" Nature Communications, 7649, Mar. 27, 2015 pp. 1-10.

H. Liu et al. "Surface Characterization of a Au/CNT Composite for a MEMS Switching Application" IEEE, 16th International Conference on Nanotechnology, Aug. 22-25, 2016, pp. 751-754.

* cited by examiner

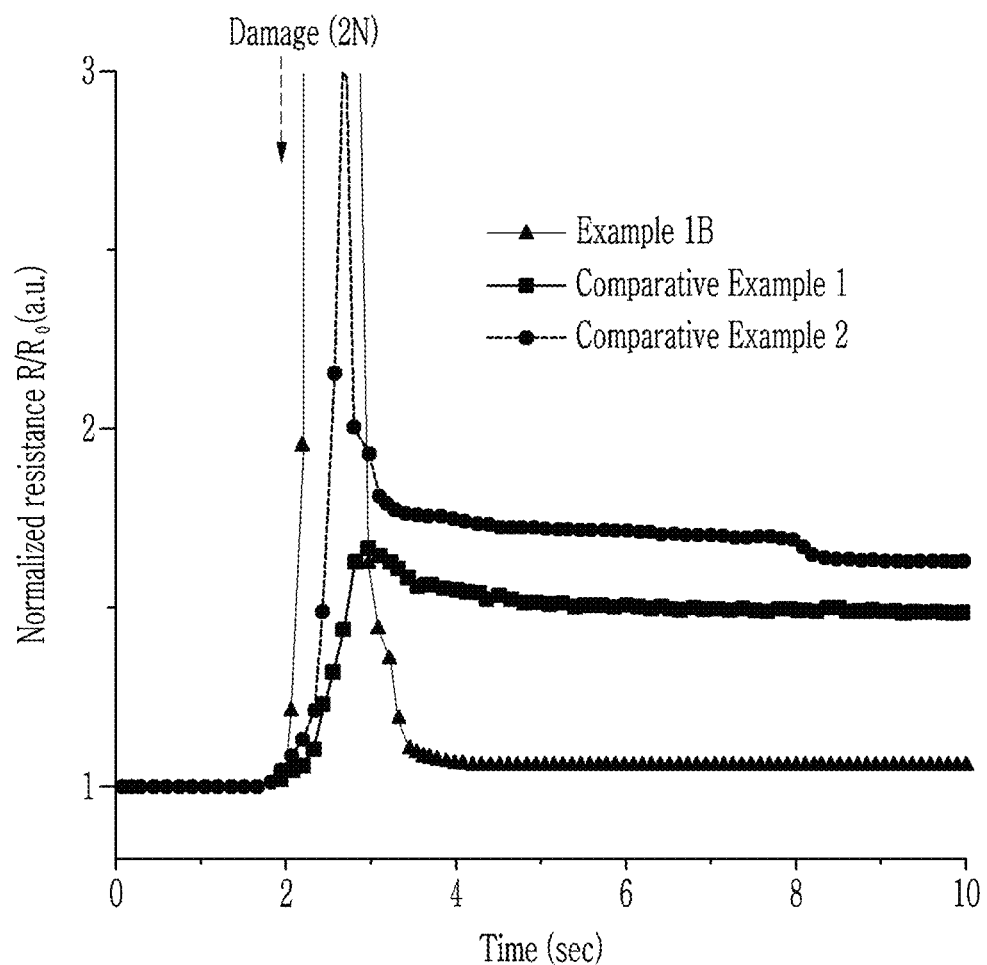

SELF-HEALING COMPOSITE AND DEVICE INCLUDING SELF-HEALING FILM

CROSS-REFERENCE TO RELATED APPLICATION

This application claims priority to and the benefit of U.S. Provisional Patent Application No. 62/691,786, filed in the United States Patent and Trademark Office on Jun. 29, 2018, the entire content of which is incorporated herein by reference.

BACKGROUND

1. Field

A self-healing composite and a device including the same are disclosed.

2. Description of the Related Art

The recent development of portable and smart electronics has changed the way humans interact and communicate with electronic devices. For example, intimate contact between humans and electronic devices has continuously been improving, with anticipation that, in the near future, wearable electronic devices may act as a second skin for humans to interact and communicate with other humans and electronics for various applications.

As a result, deformable electronic materials (e.g., polymer semiconductor materials for electronic skins) that are able to be stretched similarly to human skin and are able to endure various human motions have attracted increasing attention.

Such electronic skins may have self-healing properties that are as soft as human skins and have sufficient toughness to withstand external impacts and/or recover to their original states in the event of damage.

SUMMARY

An embodiment provides a self-healing composite having improved self-healing properties that recover their original state in the event of damage and provide softer touch and improved stretchability, and/or elastic modulus.

Another embodiment provides a device including the self-healing composite.

According to an embodiment, a self-healing composite includes a matrix including an elastomer and conductive nanostructures embedded in the matrix, wherein the elastomer includes a polymer main chain, a —HN—C(=O)—NH— containing first structural unit capable of forming a strong hydrogen bond, and a —HN—C(=O)—NH— containing second structural unit capable of forming a weak hydrogen bond.

The polymer main chain may include at least one polymer main chain of polysiloxane, polydialkylsiloxane wherein the alkyl is a C1 to C6 alkyl, polyethylene oxide (PEO), polypropylene oxide (PPO), polybutylene oxide (PBO), perfluoropolyether (PFPE), polyolefin, poly(ethylene-co-1-butylene), polybutadiene, hydrogenated poly(butadiene), a (poly(ethylene oxide)-poly(propylene oxide) copolymer, poly(hydroxyalkanoate), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, or a silicone rubber.

The polyolefin may be polyethylene (PE), polypropylene (PP), polybutylene (PB), a copolymer thereof, or a mixture thereof.

The first structural unit may be represented by Chemical Formula 1.

[Chemical Formula 1]

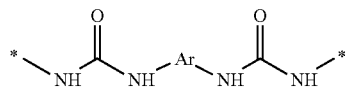

In Chemical Formula 1,

Ar is a substituted or unsubstituted C6 to C30 arylene group or C3 to C30 heteroarylene group.

The arylene group may be a single aromatic ring group; a condensed group including two or more fused aromatic ring groups; or an aromatic ring group including two or more aromatic ring groups linked by a functional group of a single bond, a fluorenylene group, a C1 to C10 cycloalkylene group, —O—, —S—, —C(=O)—, —CH(OH)—, —S(=O)$_2$—, —Si(CH$_3$)$_2$—, —(CH$_2$)$_p$— (wherein, 1≤p≤10), —(CF$_2$)$_q$— (wherein, 1≤q≤10), —C(CH$_3$)$_2$—, —C(CF$_3$)$_2$—, —C(=O)NH—, or a combination thereof.

In Chemical Formula 1, —Ar— may be an aromatic ring group that is one of a substituted or unsubstituted phenylene, a substituted or unsubstituted naphthalene, a substituted or unsubstituted anthracene, a substituted or unsubstituted phenanthrene, a substituted or unsubstituted pyrene, a substituted or unsubstituted perylene, a substituted or unsubstituted fluorene, a substituted or unsubstituted pentalene, a substituted or unsubstituted pyrazole, a substituted or unsubstituted imidazole, a substituted or unsubstituted thiazole, a substituted or unsubstituted triazole, a substituted or unsubstituted carbazole, a substituted or unsubstituted pyridine, a substituted or unsubstituted pyridazine, a substituted or unsubstituted pyrimidine, a substituted or unsubstituted pyrazine, a substituted or unsubstituted triazine, a substituted or unsubstituted indazole, a substituted or unsubstituted indolizine, a substituted or unsubstituted benzimidazole, a substituted or unsubstituted benzthiazole, a substituted or unsubstituted thienothiophene, a substituted or unsubstituted benzothiophene, a substituted or unsubstituted benzopurine, a substituted or unsubstituted isoquinoline, and a substituted or unsubstituted purine, or an aromatic ring group including two or more of the foregoing aromatic ring groups are linked by a linker.

In Chemical Formula 1, —Ar— may be represented by Chemical Formula 1A or Chemical Formula 1B.

[Chemical Formula 1A]

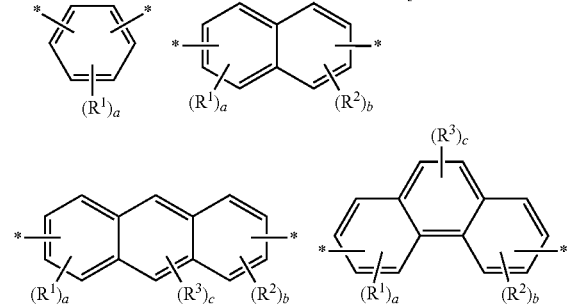

-continued

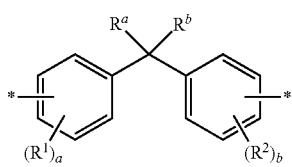

In Chemical Formula 1A, $R^1$ to $R^3$ are independently hydrogen or a C1 to C6 alkyl group, a, b, and c are the same as the number of hydrogen bound to the aromatic rings, and $R^a$ and $R^b$ are independently hydrogen, a halogen, a C1 to C6 alkyl group, or a C1 to C6 fluoroalkyl group.

[Chemical Formula 1B]

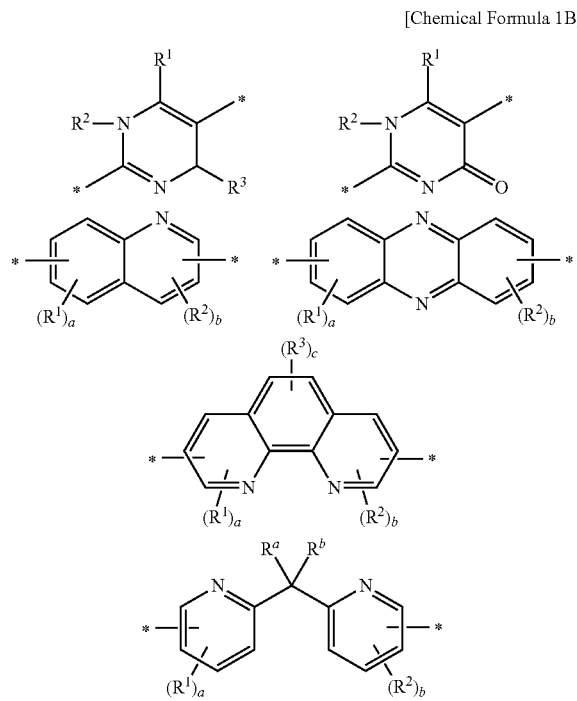

In Chemical Formula 1B, $R^1$ to $R^3$ are independently hydrogen or a C1 to C6 alkyl group, a, b, and c are the same as the number of hydrogen bound to the aromatic rings, and $R^a$ and $R^b$ are independently hydrogen, a halogen, a C1 to C6 alkyl group, or a C1 to C6 fluoroalkyl group.

The second structural unit may be represented by Chemical Formula 2-1 or Chemical Formula 2-2.

[Chemical Formula 2-1]

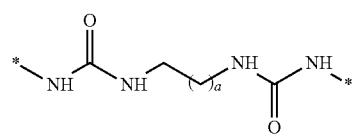

In Chemical Formula 2-1, a is an integer ranging from 5 to 20.

[Chemical Formula 2-2]

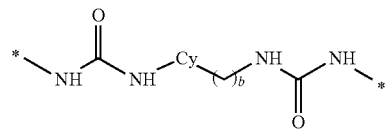

In Chemical Formula 2-2,

Cy is a substituted or unsubstituted C5 to C30 cycloalkylene group, and b is an integer of 1 or 3.

The Cy of Chemical Formula 2-2 may be represented by represented by Chemical Formula 2-2A, Chemical Formula 2-2B, or Chemical Formula 2-2C.

[Chemical Formula 2-2A]

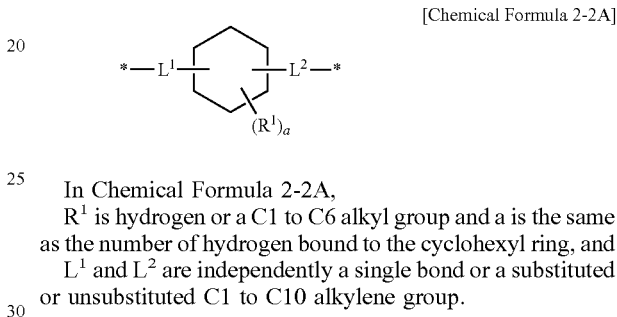

In Chemical Formula 2-2A, $R^1$ is hydrogen or a C1 to C6 alkyl group and a is the same as the number of hydrogen bound to the cyclohexyl ring, and $L^1$ and $L^2$ are independently a single bond or a substituted or unsubstituted C1 to C10 alkylene group.

[Chemical Formula 2-2B]

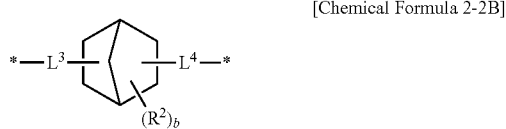

In Chemical Formula 2-2B, $R^2$ is hydrogen or a C1 to C6 alkyl group and b is the same as the number of hydrogen bound to the cyclohexyl ring, and $L^3$ and $L^4$ are independently a single bond or a substituted or unsubstituted C1 to C10 alkylene group.

[Chemical Formula 2-2C]

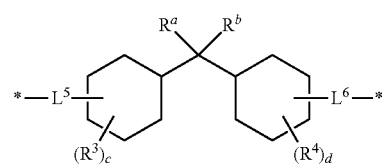

In Chemical Formula 2-2C, $R^3$ and $R^4$ are independently hydrogen or a C1 to C6 alkyl group, c and d are independently the same as the number of hydrogen bound to the cyclohexyl ring, $R^a$ and $R^b$ are independently hydrogen, a halogen, a C1 to C6 alkyl group, or a C1 to C6 fluoroalkyl group, and $L^5$ and $L^6$ are independently a single bond or a substituted or unsubstituted C1 to C10 alkylene group.

The first structural unit and the second structural unit may be included in a mole ratio of about 0.2:0.8 to about 0.5:0.5.

The first structural unit and the second structural unit may be included in an amount of about 0.01 mmol to about 10 mmol based on 1 mol of the elastomer.

The polymer main chain may be derived from a polymer having a low glass transition temperature.

The polymer may have a glass transition temperature of about −40° C. to about 40° C.

The elastomer may have a number average molecular weight (Mn) of about 10,000 to about 100,000.

The conductive nanostructures may include carbon nanotubes (CNT), carbon nanofibrils (CNF), carbon nanowalls (CNW), graphenes (or other two-dimensional (2D) materials), carbon nanotubes (CNT) doped with nanometals, carbon nanofibrils doped with nanometals, carbon nanowalls doped with nanometals, graphenes (or other two-dimensional (2D) materials) doped with nanometals, nanometals, conductive metal oxides, or a combination thereof.

The conductive nanostructures may be nanofibrils having a diameter of less than or equal to about 100 nm.

The conductive nanostructures may be included in an amount of about 0.05 to about 50 parts by weight based on 100 parts by weight of the elastomer.

The self-healing composite may have a film shape.

According to another embodiment, a device including the self-healing composite is provided.

The device may be a thin film transistor, a light emitting capacitor, an electronic skin, a sensor, a foldable device, or a stretchable device.

A method of manufacturing a self-healing composite comprising preparing a composition by dispersing the elastomer and conductive nanostructures in a solvent, applying the composition on the substrate, and removing the solvent to form the composite.

The self-healing composite has improved self-healing properties that recover original states in the event of damages, gives soft touch, and has improved stretchability.

BRIEF DESCRIPTION OF THE DRAWINGS

FIG. 6 is a graph showing the results of measuring the resistances over time after cutting the self-healing conductive film according to Example 1B and the polymer films according to Comparative Example 1 and Comparative Example 2, into two pieces and 100% stretching them.

DETAILED DESCRIPTION

Figure 1:
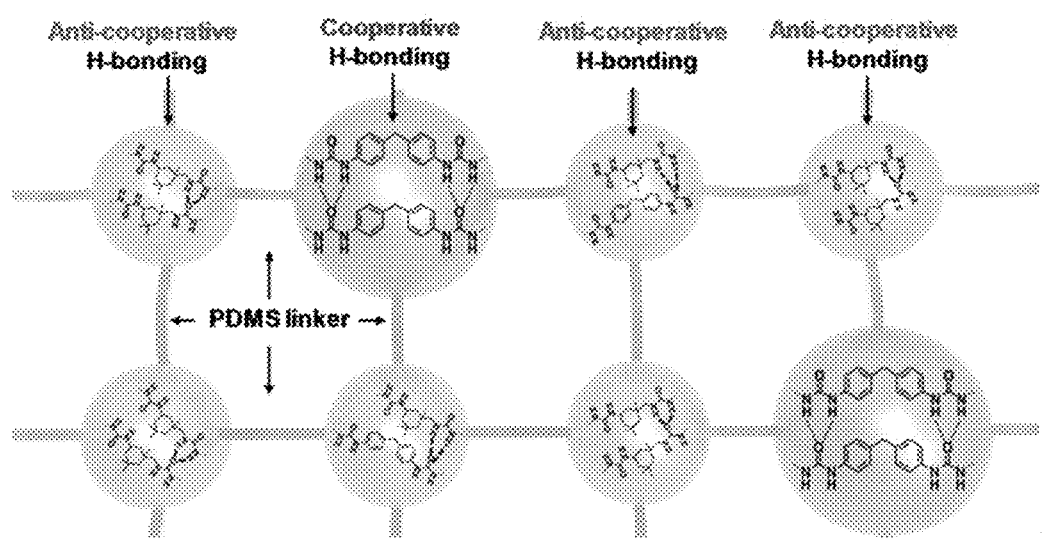
FIG. 1 is a view schematically showing a self-assembly of a PDMS-MPU-IU elastomer.

Hereinafter, embodiments will be described in detail so that the person skilled in the art in the technical field may carry out. However, the structure actually applied may be embodied in various different forms and is not limited to the embodiment described below.

As used herein, when a definition is not otherwise provided, "substituted" may refer to replacement of hydrogen of a compound or a functional group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C1 to C20 haloalkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" may refer to inclusion of at least one, for example 1 to 3 heteroatoms selected from N, O, S, Si, Se, Te, and P in a group or a compound.

As used herein, "combination thereof" may refer to a mixture, a stack, a composite, a copolymer, an alloy, a blend, a reaction product of components.

In chemical formulae, "*" may refer to a point of attachment to an atom or a group that may be the same or different.

According to an embodiment, a self-healing composite includes a matrix including an elastomer and conductive nanostructures embedded in the matrix, wherein the elastomer includes a polymer main chain, a —HN—C(═O)—NH— containing first structural unit capable of forming a strong hydrogen bond, and a —HN—C(=O)—NH— containing second structural unit capable of forming a weak hydrogen bond.

The polymer main chain of the elastomer may be derived from a polymer of a homopolymer, copolymer, or terpolymer having flexibility, and the polymer may be an alternate copolymer, block copolymer, or random copolymer, but is not particularly limited. For example, the polymer main chain may be at least one of polysiloxane, polydialkylsiloxane wherein, the alkyl is a C1 to C6 alkyl, for example polydimethylsiloxane, polyethylene oxide (PEO), polypropylene oxide (PPO), polybutylene oxide (PBO), perfluoropolyether (PFPE), polyolefin, poly(ethylene-co-1-butylene), polybutadiene, hydrogenated poly(butadiene), a (poly(ethylene oxide)-poly(propylene oxide) copolymer, poly(hydroxyalkanoate), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, or a silicone rubber. The polyolefin may be one of polyethylene (PE), polypropylene (PP), polybutylene (PB), a copolymer thereof, or a mixture thereof. The poly(ethylene oxide)-poly(propylene oxide) copolymer may be a block copolymer or a random copolymer.

The elastomer includes a —HN—C(=O)—NH— containing first structural unit capable of forming a strong hydrogen bond and a —HN—C(=O)—NH— containing second structural unit capable of forming a weak hydrogen bond which are bound to the polymer main chain. All amino groups of the —HN—C(=O)—NH— moiety present in one chain of the first structural unit capable of forming the strong hydrogen bond form hydrogen bonds with all carbonyl groups of the —HN—C(=O)—NH— moiety in another chain. At least one of the amino groups of the —HN—C(=O)—NH— moiety present in one chain of the second structural unit capable of forming the weak hydrogen bond forms a hydrogen bond with a carbonyl group of the —HN—C(=O)—NH— moiety in another chain.

The strong hydrogen bond imparts elasticity and mechanical strength, while the weak hydrogen bond imparts stretchability and energy dissipation performance.

The first structural unit may include an aromatic ring group and may be represented by Chemical Formula 1

[Chemical Formula 1]

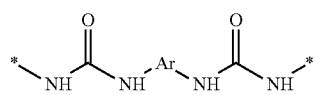

In Chemical Formula 1,
—Ar— is a substituted or unsubstituted C6 to C30 arylene group or C3 to C30 heteroarylene group.

The arylene group may be a single aromatic ring group; a condensed group including two or more fused aromatic ring groups; or an aromatic ring group including two or more aromatic ring groups linked by a functional group of a single bond, a fluorenylene group, a C1 to C10 cycloalkylene group, —O—, —S—, —C(=O)—, —CH(OH)—, —S(=O)$_2$—, —Si(CH$_3$)$_2$—, —(CH$_2$)$_p$— (wherein, 1≤p≤10), —(CF$_2$)$_q$— (wherein, 1≤q≤10), —C(CH$_3$)$_2$—, —C(CF$_3$)$_2$—, —C(=O)NH—, or a combination thereof.

In Chemical Formula 1, —Ar— may be an aromatic ring group selected from a substituted or unsubstituted phenylene, a substituted or unsubstituted naphthalene, a substituted or unsubstituted anthracene, a substituted or unsubstituted phenanthrene, a substituted or unsubstituted pyrene, a substituted or unsubstituted perylene, a substituted or unsubstituted fluorene, a substituted or unsubstituted pentalene, a substituted or unsubstituted pyrazole, a substituted or unsubstituted imidazole, a substituted or unsubstituted thiazole, a substituted or unsubstituted triazole, a substituted or unsubstituted carbazole, a substituted or unsubstituted pyridine, a substituted or unsubstituted pyridazine, a substituted or unsubstituted pyrimidine, a substituted or unsubstituted pyrazine, a substituted or unsubstituted triazine, a substituted or unsubstituted indazole, a substituted or unsubstituted indolizine, a substituted or unsubstituted benzimidazole, a substituted or unsubstituted benzthiazole, a substituted or unsubstituted thienothiophene, a substituted or unsubstituted benzothiophene, a substituted or unsubstituted benzopurine, a substituted or unsubstituted isoquinoline, and a substituted or unsubstituted purine, or an aromatic ring group including two or more of the foregoing aromatic ring groups are linked by a linker.

Herein the linker may be a single bond; a substituted or unsubstituted C1 to C30 alkylene group; or a substituted or unsubstituted C1 to C30 alkylene group including at least one linker of —O—, —NR$^a$—, —C(=O)—, —OC(=O)—, —S(=O)$_2$—, —Si(R$^a$R$^b$)$_2$—, and —C(=O)NR$^d$— (wherein, R$^a$, R$^b$, R$^c$, and R$^d$ are independently one of hydrogen, a C1 to C10 alkyl group, a C2 to C10 alkenyl group, a C2 to C10 alkynyl group, a C6 to C18 aryl group, and a C2 to C18 heteroaryl group).

In Chemical Formula 1, —Ar— may be represented by Chemical Formula 1A or Chemical Formula 1B.

[Chemical Formula 1A]

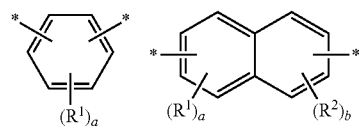

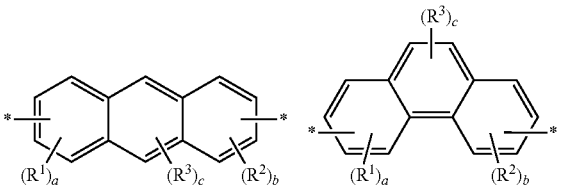

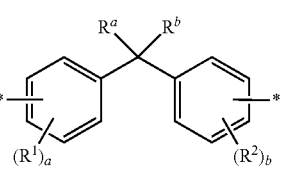

In Chemical Formula 1A,
R$^1$ to R$^3$ are independently hydrogen or a C1 to C6 alkyl group, a, b, and c are the same as the number of hydrogen bound to the aromatic rings (e.g., a, b, and c may be an integer of 0 to 4, 0 to 3, 0 to 2, or 1), and R$^a$ and R$^b$ are independently hydrogen, a halogen, a C1 to C6 alkyl group, or a C1 to C6 fluoroalkyl group.

[Chemical Formula 1B]

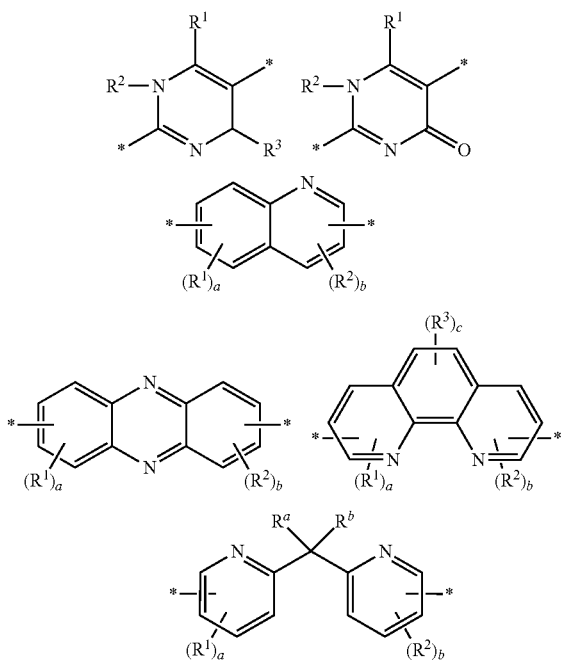

In Chemical Formula 1B, $R^1$ to $R^3$ are independently hydrogen or a C1 to C6 alkyl group, a, b, and c are the same as the number of hydrogen bound to the aromatic rings (e.g., a, b, and c may be an integer of 0 to 3, 0 to 2, or 1), $R^a$ and $R^b$ are independently hydrogen, a halogen, a C1 to C6 alkyl group, or a C1 to C6 fluoroalkyl group.

The bonds (marked with *) linked with —HN—C(=O)—NH— in Chemical Formulae 1A and 1B may be connected so that the elastomer has linearity. The aromatic ring groups of Chemical Formulae 1A and 1B present in different chains may be stacked and oriented to facilitate hydrogen bonds.

The structural unit imparting linearity of the elastomer may be represented by Chemical Formula 1AA or 1BB.

[Chemical Formula 1AA]

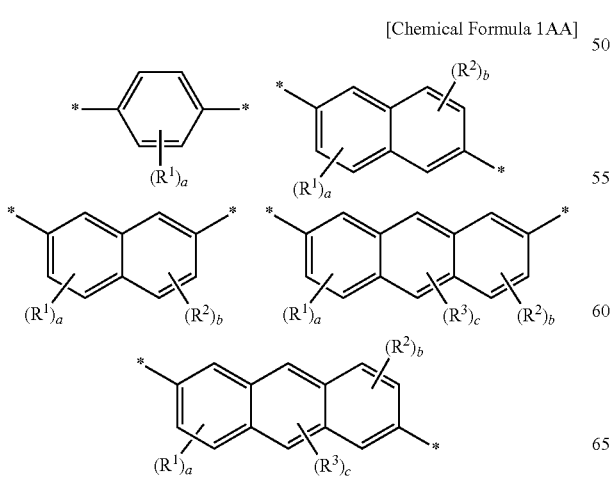

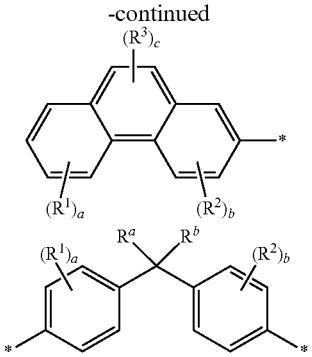

In Chemical Formula 1AA, $R^1$ to $R^3$ are independently hydrogen or a C1 to C6 alkyl group, a, b, and c are the same as the number of hydrogen bound to the aromatic rings (e.g., a, b, and c may be an integer of 0 to 4, 0 to 3, 0 to 2, or 1), and $R^a$ and $R^b$ are independently hydrogen, a halogen, a C1 to C6 alkyl group, or a C1 to C6 fluoroalkyl group.

[Chemical Formula 1BB]

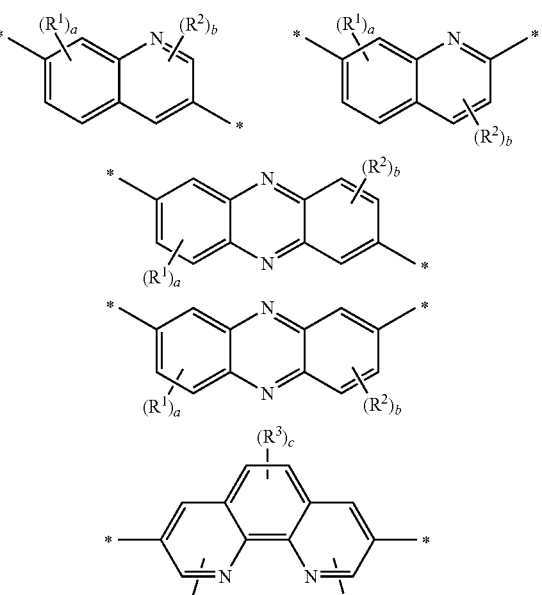

In Chemical Formula 1BB, $R^1$ to $R^3$ are independently hydrogen or a C1 to C6 alkyl group, a, b, and c are the same as the number of hydrogen bound to the aromatic rings (e.g., a, b, and c may be an integer of 0 to 3, 0 to 2, or 1), and $R^a$ and $R^b$ are independently hydrogen, a halogen, a C1 to C6 alkyl group, or a C1 to C6 fluoroalkyl group.

The second structural unit may include an aliphatic chain group or an alicyclic (non-aromatic) cyclic group and may be represented by Chemical Formula 2-1 or Chemical Formula 2-2.

[Chemical Formula 2-1]

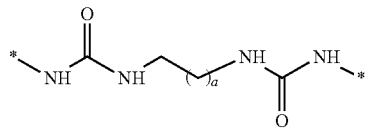

In Chemical Formula 2-1,
a is an integer ranging from 5 to 20.

[Chemical Formula 2-2]

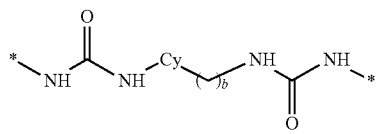

In Chemical Formula 2-2,
Cy is a substituted or unsubstituted C5 to C30 cycloalkylene group, and
b is an integer of 1 or 3.
The Cy of Chemical Formula 2-2 may be represented by Chemical Formula 2-2A, Chemical Formula 2-2B, or Chemical Formula 2-2C.

[Chemical Formula 2-2A]

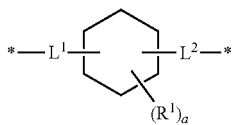

In Chemical Formula 2-2A,
$R^1$ is hydrogen or a C1 to C6 alkyl group and a is the same as the number of hydrogen bound to the cyclohexyl ring (e.g., a may be an integer of 0 to 8, 0 to 6, 0 to 4, 0 to 2, or 1), and
$L^1$ and $L^2$ are independently a single bond or a substituted or unsubstituted C1 to C10 alkylene group.

[Chemical Formula 2-2B]

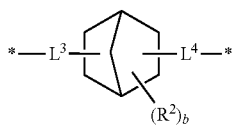

In Chemical Formula 2-2B,
$R^2$ is hydrogen or a C1 to C6 alkyl group and b is the same as the number of hydrogen bound to the cyclohexyl ring (e.g., b may be an integer of 0 to 8, 0 to 6, 0 to 4, 0 to 2, or 1), and $L^3$ and $L^4$ are independently a single bond or a substituted or unsubstituted C1 to C10 alkylene group.

[Chemical Formula 2-2C]

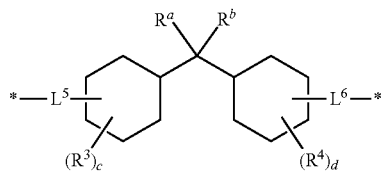

In Chemical Formula 2-2C,
$R^3$ and $R^4$ are independently hydrogen or a C1 to C6 alkyl group, c and d are independently the same as the number of hydrogen bound to the cyclohexyl ring (e.g., c and d may be an integer of 0 to 8, 0 to 6, 0 to 4, 0 to 2, or 1),
$R^a$ and $R^b$ are independently hydrogen, a halogen, a C1 to C6 alkyl group, or a C1 to C6 fluoroalkyl group, and
$L^5$ and $L^6$ are independently a single bond or a substituted or unsubstituted C1 to C10 alkylene group.
Chemical Formula 2-2A may be represented by Chemical Formula 2-2AA, Chemical Formula 2-2B may be represented by Chemical Formula 2-2BB, and Chemical Formula 2-2C may be represented by Chemical Formula 2-2CC.

[Chemical Formula 2-2AA]

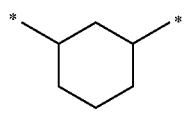

[Chemical Formula 2-2BB]

[Chemical Formula 2-2CC]

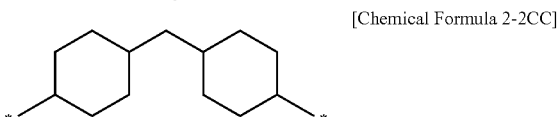

In Chemical Formula 2-2AA, Chemical Formula 2-2BB, and Chemical Formula 2-2CC, hydrogen of each ring may be replaced by a C1 to C6 alkyl group.
When the polymer main chain is polydialkylsiloxane, the first structural unit is a moiety derived from 4,4'-methylenebis(phenyl urea) (MPU), and the second structural unit is a moiety derived from isophorone bisurea (IU), the elastomer may include repeating units of Chemical Formulae 3-1 and 3-2.

[Chemical Formula 3-1]

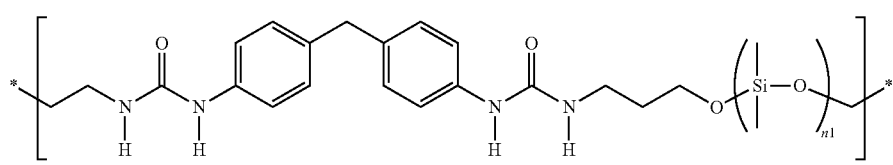

[Chemical Formula 3-2]

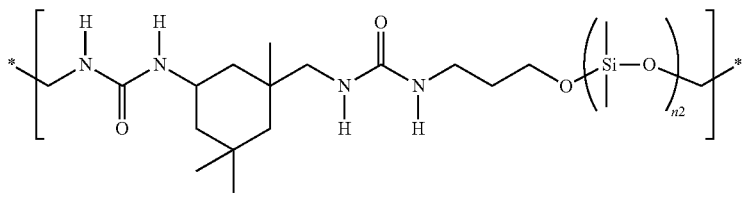

The n-1 of Chemical Formula 3-1 and the n-2 of Chemical Formula 3-2 may independently be an integer of 10 to 200, for example 20 to 150, 20 to 100 or 30 to 40.

In an embodiment, a mole ratio of the first structural unit configured to impart a strong hydrogen bond and the second structural unit configured to impart a weak hydrogen bond may be controlled the according to the desired properties of the composite. As the first structural unit increases, the mechanical strength (Young's modulus and fracture energy) may increase, and as the second structural unit increases, a self-healing rate becomes faster and a self-healing capability may be improved. For example, the first structural unit and the second structural unit may be included in a mole ratio of about 0.2:0.8 to about 0.8:0.2, about 0.3:0.7 to about 0.7:0.3, about 0.4:0.6 to about 0.6:0.4, or about 0.5:0.5.

Each of the first structural unit and the second structural unit may be included in an amount of greater than or equal to about 0.01 mmol, for example greater than or equal to about 0.02 mmol, greater than or equal to about 0.03 mmol, greater than or equal to about 0.04 mmol, or greater than or equal to about 0.05 mmol and less than or equal to about 10 mmol, for example less than or equal to about 9 mmol, less than or equal to about 8 mmol, or less than or equal to about 7 mmol based on 1 mol of the elastomer. Within the ranges, elasticity, mechanical strength and self-healing capability of the composite including the elastomer may be easily controlled.

The elastomer may have a number average molecular weight (Mn) of greater than or equal to about 10,000, for example greater than or equal to about 11,000, or greater than or equal to about 12,000 and less than or equal to about 100,000, for example less than or equal to about 105,000, less than or equal to about 110,000, or less than or equal to about 115,000. When the number average molecular weight is within the ranges, the elastomer may exhibit improved transparency and self-healing properties. The number average molecular weight may be an average molecular weight, reduced to polystyrene, measured using gel permeation chromatography.

The polymer main chain may be derived from a polymer having a low glass transition temperature. The polymer may have a glass transition temperature of greater than or equal to about −40° C., for example greater than or equal to about −30° C., or greater than or equal to about −20° C. and less than or equal to about 40° C., for example less than or equal to about 30° C., or less than or equal to about 20° C. When the glass transition temperature is within the ranges, the elastomer may exhibit improved transparency and self-healing properties.

The main chains of the elastic polymer may be cross-linked by a plurality of non-covalently hydrogen bonding interactions to form a supramolecular elastomer network. That is, the chains of the elastomer may be self-assembled by cross-linking successively through hydrogen bonds of the —HN—C(=O)—NH— moiety. Polymers cross-linked by hydrogen bonds may have a higher self-healing rate and better stretchability and self-healing performance than covalently bonded cross-linking structures. Therefore, the composite including the elastomer may have high stretchability even under ambient conditions, so that it may be quickly recovered even by repeated stretching of the composite including the elastomer. Also, when the composite is broken, it may have self-healing characteristics to easily be re-bonded and thus to recover original composite. In an embodiment, the elastomer including the composite may exhibit self-healing efficiency of about 75% after 48 hours at room temperature (25° C.) and about 100% self-healing efficiency after 60 hours at 60° C.

Figure 2:
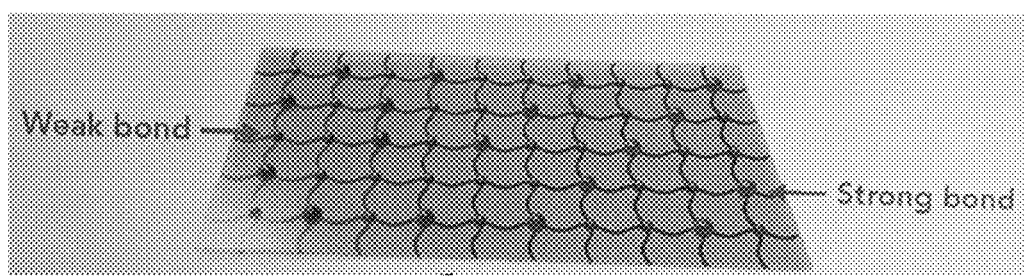
FIG. 2 is a schematic view of a composite having a supramolecular network.

The stretchability and self-healing capability of the elastomer may be for example described. Exemplified polymer includes polydimethylsiloxane (PDMS) as the polymer main chain, a moiety derived from 4,4'-methylenebis(phenyl urea) (MPU) as the first structural unit, and a moiety derived from isophorone bisurea (IU) as the second structural unit. Self-assembly of PDMS-MPU-IU elastomer having the structure is shown in FIGS. 1 and 2. FIG. 1 is a view schematically showing a self-assembly of a PDMS-MPU-IU elastomer and FIG. 2 is a schematic view of a composite having a supramolecular network. Referring to FIG. 1, the hydrogen bond of MPU-MPU (marked a large circle) forms a strong hydrogen bond (cooperative H-bonding, four hydrogen bonds) and a hydrogen bond of MPU-IU or IU-IU (marked a small circle) forms a weak hydrogen bond (anti-cooperative H-bonding, and two hydrogen bonds. In the supramolecular network, the strong hydrogen bond forms a strong cross-linking bond and the weak hydrogen bond forms a weak cross-linking bond.

When externally stressed, the weak hydrogen bond may be first broken and become more stretchable rather than the strong hydrogen bond, and thus stress energy dissipation may be enabled.

Figure 3:
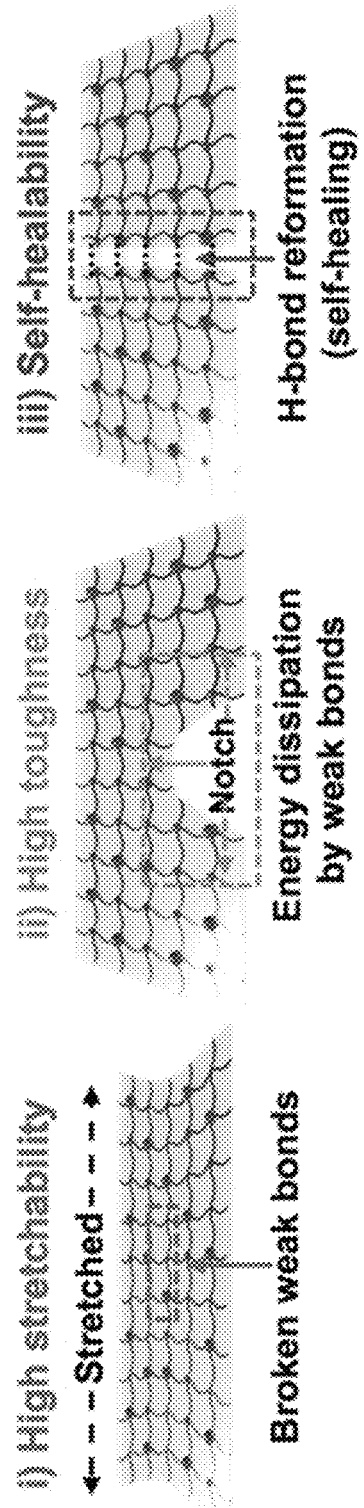
FIG. 3 is a schematic view showing a change in external stress of a composite having a supramolecular network.

A change against an external stress of the composite having a supramolecular network of the elastomer is shown in FIG. 3. FIG. 3 is a schematic view showing a change in external stress of a composite having a supramolecular network. Referring to FIG. 3, when the composite (e.g., film) is stretched, (i) it exhibits high stretchability, (ii) when a notched film (5 mm×5 mm) is stretched, a strong hydrogen bond reduces or prevents the cracks from proceeding further while the weak hydrogen bond breaks and dissipates stress energy, and (iii) If the weak hydrogen bond is broken, the stress on the strong hydrogen bond is lowered and self-healed by regeneration of the hydrogen bond.

The elastomers are cross-linked to form a matrix of a network structure. In this matrix, conductive nanostructures may be embedded to provide an improved self-healing composite having improved conductivity and/or dielectric properties.

The conductive nanostructures may include carbon nanotubes (CNT), carbon nanofibrils (CNF), carbon nanowalls (CNW), graphenes (or other two-dimensional (2D) materials), carbon nanotubes (CNT) doped with nanometals, carbon nanofibrils doped with nanometals, carbon nanowalls doped with nanometals, graphenes (or other two-dimensional (2D) materials) doped with nanometals, nanometals, conductive metal oxides, or a combination thereof.

The nanometals may be one of silver (Ag), gold (Au), platinum (Pt), copper (Cu), aluminum (Al), nickel (Ni), molybdenum (Mo), chromium (Cr), tantalum (Ta), titanium (Ti), and a combination thereof.

In the carbon nanotubes doped with the nanometals, the carbon nanofibrils doped with the nanometals, the carbon nanowalls doped with the nanometals, and the graphenes (or other two-dimensional (2D) materials) doped with the nanometals, the nanometal may be doped in the carbon nanotubes, carbon nanofibrils, carbon nanowalls, or graphenes (or other two-dimensional (2D) materials) in an amount of greater than or equal to about 0.1 wt %, greater than or equal to about 0.2 wt %, greater than or equal to about 0.3 wt %, greater than or equal to about 0.4 wt %, or greater than or equal to about 0.5 wt % and less than or equal to about 10 wt %, less than or equal to about 9 wt %, less than or equal to about 8 wt %, less than or equal to about 7 wt %, less than or equal to about 6 wt % or less than or equal to about 5 wt % based on each total amount of the carbon nanotubes doped with the nanometals, the carbon nanofibrils doped with the nanometals, the carbon nanowalls doped with the nanometals, and the graphenes (or other two-dimensional (2D) material) doped with the nanometals.

The conductive metal oxide may be one of indium tin oxide (ITO), indium zinc oxide (IZO), tin oxide (SnO), aluminum tin oxide (AlTO), fluorine tin oxide (FTO), and a combination thereof.

The conductive nanostructures may be nanofibrils having a diameter of less than or equal to about 100 nm.

The conductive nanostructures may have for example a diameter of less than or equal to about 100 nm, less than or equal to about 80 nm, less than or equal to about 50 nm, for example about 1 nm to about 100 nm, about 1 nm to about 80 nm, or about 1 nm to about 50 nm.

The conductive nanostructures may be for example included in an amount of greater than or equal to about 0.05 parts by weight, greater than or equal to about 0.1 parts by weight, greater than or equal to about 0.2 parts by weight, greater than or equal to about 0.4 parts by weight, greater than or equal to about 0.6 parts by weight, greater than or equal to about 0.8 parts by weight, or greater than or equal to about 1 part by weight based on 100 parts by weight of the elastomer. In addition, the conductive nanostructures may be for example included in an amount of less than or equal to about 50 parts by weight, less than or equal to about 45 parts by weight, less than or equal to about 40 parts by weight, less than or equal to about 35 parts by weight, less than or equal to about 30 parts by weight, less than or equal to about 25 parts by weight, or less than or equal to about 20 parts by weight based on 100 parts by weight of the elastomer.

The self-healing composite may be manufactured in various shapes such as particles, films, and the like.

Hereinafter, a method of manufacturing the self-healing composite in the form of a film will be described.

According to an embodiment, a self-healing film may be manufactured by preparing a composition by dispersing an elastomer and conductive nanostructures in a solvent, applying the composition on the substrate, and removing the solvent to form a film.

The elastomer and conductive nanostructures are the same as described above. The solvent may include for example chloroform, chlorobenzene, toluene, dimethylform aldehyde, tetrahydrofuran, dimethylsulfoxide, xylene, tetralin, or a combination thereof, but is not limited.

The composition may be used after heating and then cooling the same to room temperature in order to obtain a viscosity suitable for applying.

The substrate may be a substrate made of for example, a silicon wafer, glass, or a polymer. The applying of the composition on the substrate may be performed by a spin coating, a slit coating, a bar coating, a dip coating, a spray coating, an inkjet printing, but is not limited thereto. The applying of the composition may be performed by for example spin coating.

The film manufactured as above may be transferred onto an elastic substrate. For example, the film may be in contact with an elastic substrate to be transferred from the substrate to the elastic substrate and thereby the substrate may be removed.

The film may be subjected to a molding process or a bonding process.

The self-healing composite may have a stretchability of about 3000% (without notch) and a stretchability of about 1200% to about 2000% (with notch). It may also have a Young's modulus of about 0.1 MPa to about 3.0 MPa, for example about 0.22 MPa to about 1.5 MPa, and fracture energy of about 12000 $J/m^2$ to about 15000 $J/m^2$.

The self-healing composite also has improved stretchability and self-healing performance in water (for example, fresh water, sea water, chlorinated water, or other types of water), sweat and/or artificial sweat or other forms of liquid. For example, it may exhibit stretchability of about 1100% in water and may be self-healable within 24 hours after damage.

The self-healing composite may have improved elasticity and/or toughness and may exhibit foldable and/or bendable and/or rollable characteristics, and therefore is suitable to be applied to flexible devices.

As the self-healing film is thicker, the self-healing time may be shorter. For example, if the thickness of the self-healing film is about 10 μm to about 100 μm, the self-healing film may have a self-healing time of less than 60 minutes, while if the thickness of the film is about 100 μm to about 1,000 μm, a self-healing time may be less than 10 minutes, when a scratch with a 4H pencil and a 1 kgf load is formed.

The self-healing composite according to an embodiment may be colorless and/or transparent and/or may have high transparency. For example, the self-healing film may have a light transmittance of greater than or equal to about 90% or greater than or equal to about 91.5%.

In an embodiment, the light transmittance may be greater than or equal to about 98% in a wavelength region of about 400 nm to about 1000 nm. In addition, the self-healing composite may have a yellowness index of less than or equal to about 1%, for example less than or equal to about 0.2%. A change in the yellowness index (delta yellowness index) measured after exposing the self-healing composite to ultraviolet (UV) for 72 hours may be less than about 1%. Also, the self-healing composite may have a haze of less than about 1.

The aforementioned self-healing composite may be applied to parts of various flexible electronic devices (e.g., electrodes, dielectric materials, etc.). The self-healing composite may be applied as an electrode, a charge transport layer, or a dielectric layer in electronic devices such as a thin film transistor, light emitting capacitor, a solar cell, an organic light emitting diode (OLED) display, an organic sensor, an electrocardiogram (ECG) sensor, a capacitive strain sensor, a wearable electronic device, a wearable circuitry, a smart robot, a human motion sensor, and an actuator.

In addition, the self-healing composite may be used as a tactile sensor, a health monitoring sensor, a temperature sensor, an artificial prosthetic, an artificial muscle, an electronic skin (e-skin), and the like.

Hereinafter, an example of a thin film transistor will be described with reference to drawings.

Figure 4:
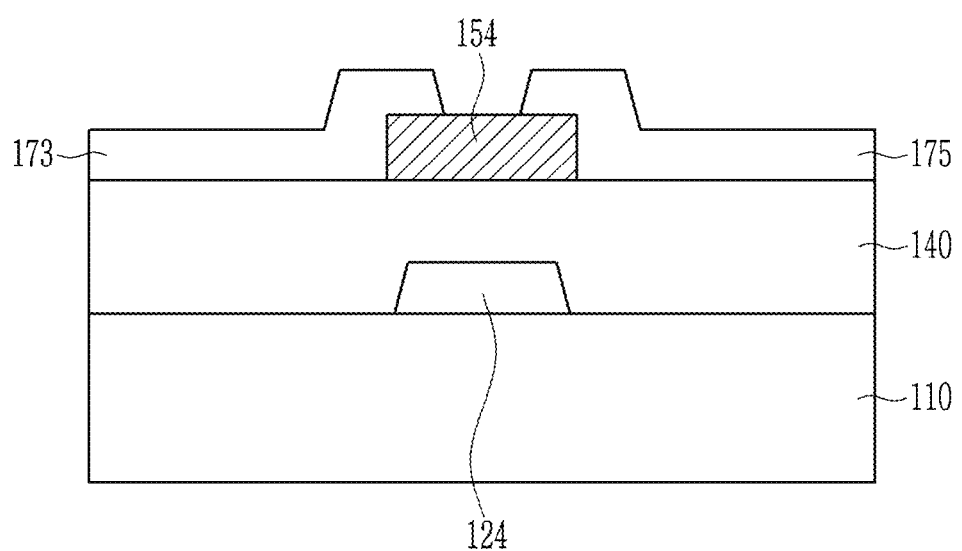
FIG. 4 is a schematic cross-sectional view of a thin film transistor according to an embodiment.

FIG. 4 is a schematic cross-sectional view of a thin film transistor according to an embodiment.

Referring to FIG. 4, a thin film transistor according to an embodiment includes a substrate 110, a gate electrode 124, a gate insulating layer 140, an active layer 154, a source electrode 173, and/or a drain electrode 175.

The substrate 110 may be for example an insulating substrate such as a transparent glass or polymer, or a silicon wafer. The polymer may include for example polyethyleneterephthalate, polyethylenenaphthalate, polycarbonate, polyacrylate, polyimide, or a combination thereof, but is not limited thereto.

The gate electrode 124 is formed on the substrate 110. The gate electrode 124 is connected to a gate line (not shown) transferring a gate signal. The gate electrode 124 may be doped at a high concentration in a silicon substrate or may be made of gold (Au), copper (Cu), nickel (Ni), aluminum (Al), molybdenum (Mo), chromium (Cr), tantalum (Ta), titanium (Ti), an alloy thereof, or a combination thereof.

The gate insulating layer 140 is formed on the gate electrode 124. The gate insulating layer 140 may be made of an organic material and/or an inorganic material. Examples of the organic material may include a soluble polymer compound such as a polyvinyl alcohol-based compound, a polyimide-based compound, a polyacryl-based compound, a polystyrene-based compound, and benzocyclobutane (BCB), and examples of the inorganic material may include a silicon nitride ($SiN_x$) and a silicon oxide ($SiO_2$).

An active layer 154 is formed on the gate insulating layer 140. The active layer 154 may include an organic semiconductor.

A source electrode 173 and a drain electrode 175 are formed on the active layer and are electrically connected with the active layer 154. The source electrode 173 and the drain electrode 175 face each other in the center of the gate electrode 124. The source electrode 173 is electrically connected to the data line (not shown) transferring the data signal. The source electrode 173 and the drain electrode 175 may include at least one metal of gold (Au), copper (Cu), nickel (Ni), aluminum (Al), molybdenum (Mo), chromium (Cr), tantalum (Ta), titanium (Ti), an alloy thereof, or a combination thereof.

A least one of the gate electrode 124, the source electrode 173, and the drain electrode 175 may be manufactured with the self-healing composite.

Although the thin film transistor having a top contact/bottom gate structure is exemplified as one example of the thin film transistor, it is not limited thereto, and it may be applied to all thin film transistors having the structures such as a bottom contact/top gate structure, a bottom contact/bottom gate structure, a top contact/top gate structure.

The thin film transistor may be applied to a switch or driving device of various electronic devices and the electronic device may be for example a liquid crystal display (LCD), an organic light emitting diode (OLED) display, an electrophoretic display, an organic photoelectric device, and an organic sensor, but is not limited thereto.

Hereinafter, the embodiments are illustrated in more detail with reference to examples. However, these are examples, and the present scope is not limited thereto.

Synthesis Example 1: Synthesis of
PDMS-MPU$_{0.4}$-IU$_{0.6}$ Elastomer $H_2N$-PDMS-$NH_2$ (100 g, Mn=6000, 1 eq, Gelest Inc.) is dissolved in anhydrous $CHCl_3$ (400 mL), and 10 mL of $Et_3N$ is added to the solution at 0° C. under argon. After stirring the obtained mixture for one hour, a solution prepared by dissolving a mixture of 4,4'-methylenebis(phenyl isocyanate) (2.0 g, 0.4 eq.) and isophorone diisocyanate (2.7 g, 0.6 eq.) in $CHCl_3$ is dripped thereinto. While maintained at 0° C. by using ice water, the obtained mixture is stirred for one hour.

The obtained solution is maintained at room temperature and stirred to perform a reaction for 4 days. After the reaction, MeOH (15 mL) is added thereto to remove isocyanate remaining there and then, stirred for 30 minutes. Subsequently, a solution obtained therefrom is concentrated until a volume is reduced down to ½, and 60 mL of MeOH is poured into a precipitate therefrom. A white precipitate-like viscous liquid is generated, and the mixture is allowed to stand for 30 minutes. Supernatant liquid is poured into another container (decanted), and 100 mL of $CHCl_3$ is added thereto to dissolve the product therefrom. The dissolution-precipitation-decandation processes are three times repeated to vacuum-evaporate a final product and remove the solvent and a slight amount of $Et_3N$. 65 g (a yield: 63%) of the product (a PDMS-MPU$_{0.4}$-IU$_{0.6}$ elastomer) is obtained. The obtained elastomer has a molecular weight as follows: (measured by GPC, Mw=103,400; Mn=65,000 (D=1.6))

$^1$H NMR (400 MHz, d5-THF): δ 7.33 (d, J=8.0 Hz, 4H), 6.97 (d, J=8.0 Hz, 4H), 3.77 (s, 2H), 0.01 (b, 1325H). 13C NMR (400 MHz, CDCl3): δ 158.78, 139.18, 137.31, 125.34.

Synthesis Example 2: Synthesis of
PDMS-MPU$_{0.2}$-IU$_{0.8}$ Elastomer

A PDMS-MPU$_{0.2}$-IU$_{0.8}$ elastomer is synthesized by controlling a mole ratio of 4,4'-methylenebis(phenyl isocyanate) and isophorone diisocyanate. The obtained elastomer has a molecular weight as follows (measured by GPC, Mw=112,000; Mn=84,000 (D=1.3))

$^1$H NMR (400 MHz, d5-THF): δ 7.33 (d, J=8.0 Hz, 4H), 6.97 (d, J=8.0 Hz, 4H), 3.77 (s, 2H), 0.01 (b, 2531H).

Synthesis Example 3: Synthesis of
PDMS-MPU$_{0.3}$-IU$_{0.7}$ Elastomer

A PDMS-MPU$_{0.3}$-IU$_{0.7}$ elastomer is synthesized by controlling a mole ratio of 4,4'-methylenebis(phenyl isocyanate) and isophorone diisocyanate. The obtained elastomer has a molecular weight as follows (measured by GPC, Mw=116,000; Mn=73,000 (D=1.6))

$^1$H NMR (400 MHz, d5-THF): δ 7.33 (d, J=8.0 Hz, 4H), 6.97 (d, J=8.0 Hz, 4H), 3.77 (s, 2H), 0.01 (b, 1633H).

Synthesis Example 4: Synthesis of
PDMS-MPU$_{0.5}$-IU$_{0.5}$ Elastomer

A PDMS-MPU$_{0.5}$-IU$_{0.5}$ elastomer is synthesized by controlling a mole ratio of 4,4'-methylenebis(phenyl isocyanate)

and isophorone diisocyanate. The obtained elastomer has a molecular weight as follows (measured by GPC, Mw=99,000; Mn=69,000 (D=1.4))

$^1$H NMR (400 MHz, d5-THF): δ 7.33 (d, J=8.0 Hz, 4H), 6.97 (d, J=8.0 Hz, 4H), 3.77 (s, 2H), 0.01 (b, 1011H).

Example 1A: Manufacture of Self-Healing Insulating Film 4 g of the elastomer according to Synthesis Example 1 is added to 20 mL of chloroform (CHCl$_3$) and the, stirred at 50° C. The obtained solution is stirred for greater than or equal to 3 hours and slowly cooled down to room temperature (25° C.). The obtained solution is poured out on an OTS (octadecyl trichlorosilane)-treated 4-inch silicon substrate and dried at room temperature (25° C.) for 6 hours and then, at 80° C. under reduced pressure condition (about 100 torr) for 3 hours to form an insulating polymer film. The insulating polymer film is cut into a predetermined or alternatively, desired, size and then, used as a sample (an insulating film) for a test.

Examples 2A to 4A: Manufacture of Self-Healing Insulating Films

Each insulating polymer film is manufactured according to the same method as Example 1A except that the elastomers according to Synthesis Examples 2, 3, and 4 are respectively used instead of the elastomer according to Synthesis Example 1. The insulating polymer films are cut into a predetermined or alternatively, desired, size and then, used as samples for a test.

Example 1B: Manufacture of Self-Healing Conductive Film 10 mg of CNT (P2-SWNTs, Carbon Solution, Inc.) is dispersed into 60 ml of chloroform. The obtained CNT solution is uniformly coated on an OTS-treated 4-inch silicon substrate in a spray-coating method. 4 g of the elastomer according to Synthesis Example 1 is added to 20 mL of chloroform (CHCl$_3$) and then, stirred at 50° C. The obtained solution is stirred for greater than to equal to 3 hours and slowly cooled down to room temperature (25° C.). The obtained solution is poured onto an OTS-treated 4-inch silicon substrate and dried at room temperature (25° C.) for 6 hours and then, at 80° C. under a reduced pressure condition (about 100 torr) for 3 hours to form a conductive polymer film. The conductive polymer film is cut into a predetermined or alternatively, desired, size and used as a sample (a conductive film) for a test.

Examples 2B to 4B: Manufacture of Self-Healing Conductive Films

Conductive polymer films are manufactured according to the same method as Example 1B except that the elastomers according to Synthesis Examples 2, 3, and 4 are respectively used instead of the elastomer according to Synthesis Example 1. The conductive polymer films are cut into a predetermined or alternatively, desired, size and then, used as a sample for a test.

Example 5B: Manufacture of Self-Healing Conductive Film 3 ml of an AgNW (Zhejiang KECHUANG advanced materials technology Co., Ltd.) solution is dispersed in 30 ml of isopropanol (diluted solution in 1:10). The obtained AgNW solution is uniformly coated on an OTS-treated 4-inch silicon substrate in a spray coating method. 4 g of the elastomer according to Synthesis Example 1 is added to 20 mL of chloroform (CHCl$_3$) and then, stirred at 50° C. The obtained solution is stirred for greater than or equal to 3 hours and slowly cooled down to room temperature (25° C.). The obtained solution is poured onto an OTS-treated 4-inch silicon substrate and dried at room temperature (25° C.) for 6 hours and then, at 80° C. under a reduced pressure condition (about 100 torr) for 3 hours to form a conductive polymer film. The conductive polymer film is cut into a predetermined or alternatively, desired, size and used as a sample for a test.

Examples 6B to 8B: Manufacture of Self-Healing Conductive Films

Conductive polymer films are manufactured according to the same method as Example 5B except that the elastomers according to Synthesis Examples 2, 3, and 4 are respectively used instead of the elastomer according to Synthesis Example 1. The conductive polymer films are cut into a predetermined or alternatively, desired, size and used as a sample for a test.

Example 9B: Manufacture of Self-Healing Conductive Film

A conductive polymer film is manufactured according to the same method as Example 1B except that Au-doped CNT is used instead of CNT. The Au-doped CNT is prepared according to the method disclosed in the article (Surface characterization of an Au/CNT composite for a MEMS switching application, Hong Liu et al. Proceedings of the 16th International Conference on Nanotechnology, Sendai, Japan, Aug. 22-25, 2016). The conductive polymer film is cut into a predetermined or alternatively, desired, size and used as a sample for a test.

Comparative Example 1: Manufacture of Polymer Film

A polymer film is manufactured according to the same method as Example 1 except that a styrene-ethylene-butylene-styrene copolymer (SEBS, Mw=100,000 (Tuftec H1062 (Asahi Kasei Chemicals)) instead of the elastomer according to Synthesis Example 1. The polymer film is cut into a predetermined or alternatively, desired, size and then, used as a sample for a test.

Comparative Example 2: Manufacture of Polymer Film

A polymer film is manufactured according to the same method as Example 1A except that polydimethylsiloxane (PDMS, Mw=6650 to 12000) is used instead of the elastomer according to Synthesis Example 1. The polymer film is cut into a predetermined or alternatively, desired, size and then, used as a sample for a test.

Evaluation 1: Self-Healing Properties of Films

Figure 5A:
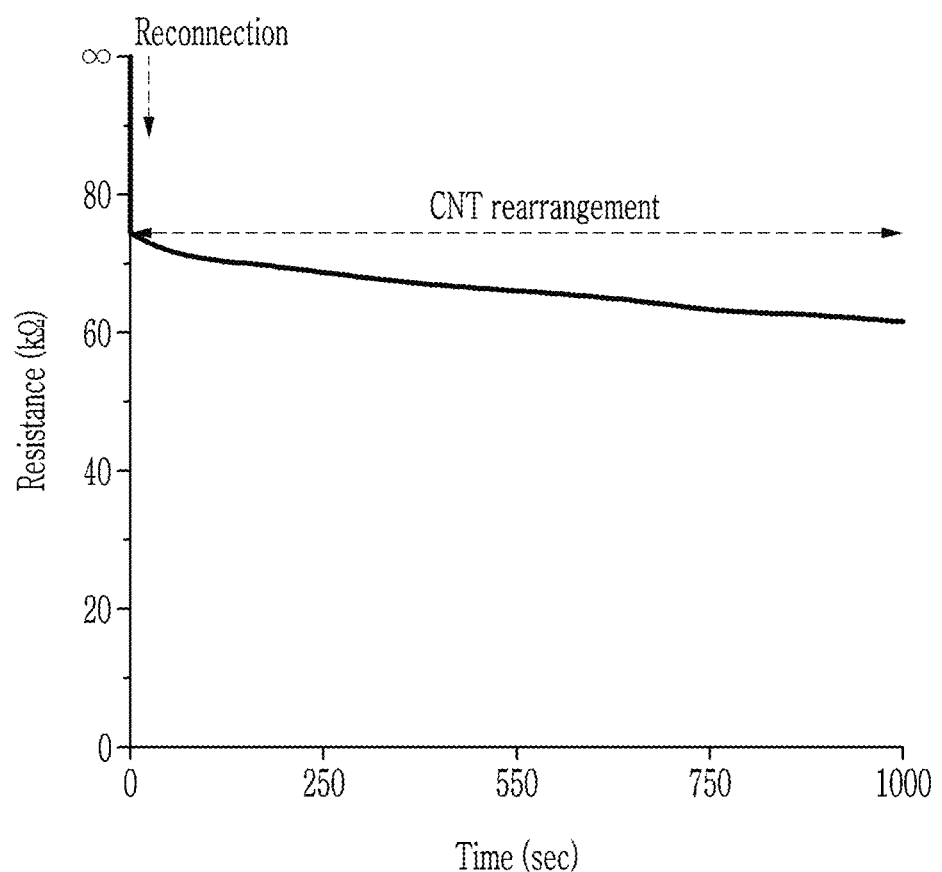
FIG. 5A is a graph showing the results of measuring the resistance over time after cutting the self-healing conductive film according to Example 1B.
Figure 5B:
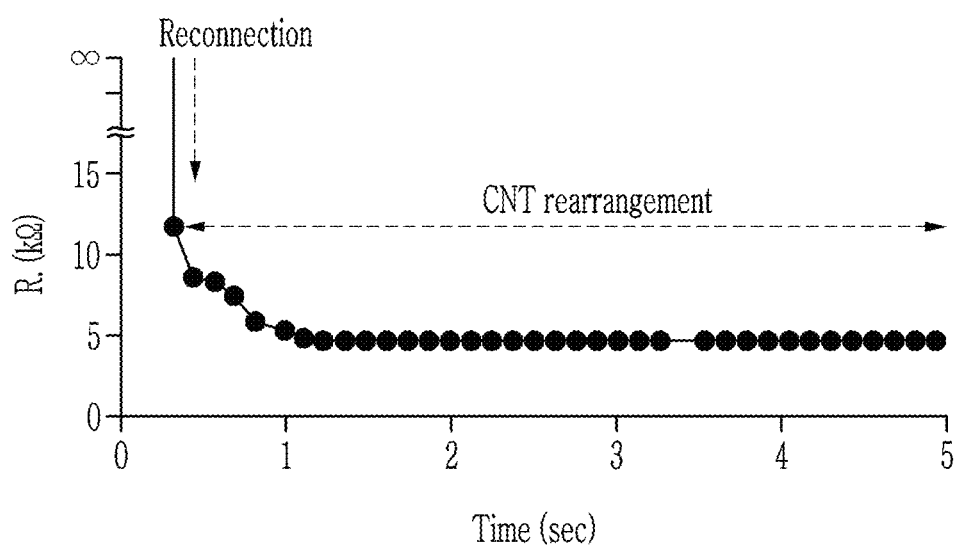
FIG. 5B shows a resistance measured after cutting the self-healing conductive film according to Example 9B and then physically contacting it.

The self-healing conductive films manufactured according to Example 1B and Example 9B are cut and then, physically contacted and adhered again. Resistance thereof is measured as time goes and then, shown in FIGS. 5A and 5B. FIG. 5A is a graph showing the results of measuring the resistance over time after cutting the self-healing conductive film according to Example 1B. FIG. 5B shows a resistance measured after cutting the self-healing conductive film according to Example 9B and then physically contacting it.

Referring to FIG. 5A, with the physical contact, conductivity of the self-healing conductive film according to Example 1B is simultaneously recovered and completely recovered within 24 hours. Referring to FIG. 5B, when the self-healing conductive film according to Example 9B is cut and reattached by the physical contact, the resistance is saturated within 5 seconds due to rearrangement of CNTs.

The self-healing conductive film according to Example 1B and the polymer films according to Comparative Example 1 and Comparative Example 2 are cut into two pieces and 100% stretched. The resistances over time are measured and shown in FIG. 6 and the resistances according to the tensile strains are measured and shown in FIG. 7. Referring to FIG. 6, resistance of the self-healing conductive film according to Example 1B after the cutting is recovered into an equivalent resistance level thereof before the cutting, but the polymer film according to Comparative Example 1 shows no large resistance change before and after the cutting, and the polymer film of Comparative Example 2 shows greatly increased resistance after the cutting compared with that before the cutting.

Figure 7:
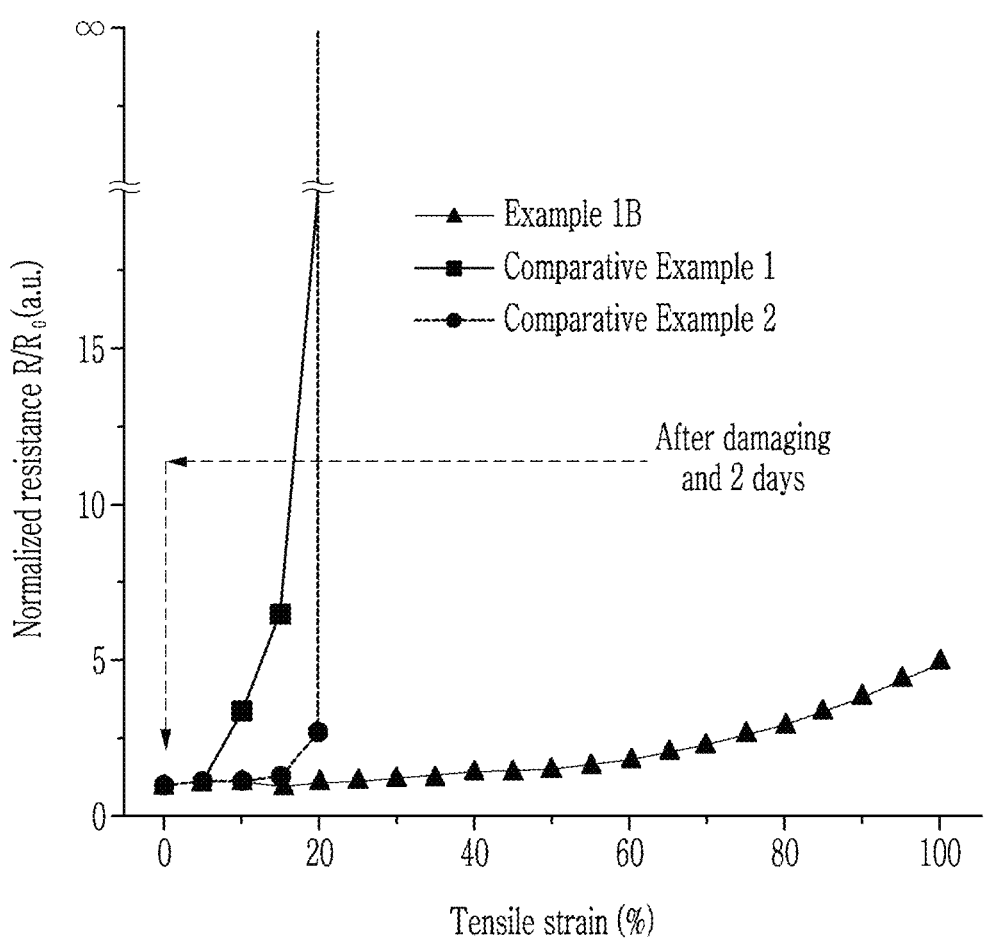
FIG. 7 is a graph showing the results of measuring the resistances according to the tensile strains after cutting the self-healing conductive film according to Example 1B and the polymer films according to Comparative Example 1 and Comparative Example 2, into two pieces and 100% stretching them.

In addition, referring to FIG. 7, resistance of the self-healing conductive film according to Example 1B is completely recovered within 2 days after the cutting and not much increased while stretched up to 100%, and accordingly, improved mechanical strength is obtained. On the contrary, in the polymer films according to Comparative Examples 1 and 2, a damage formed by cutting at a stretching rate of about 20% is not completely recovered.

Figure 8:
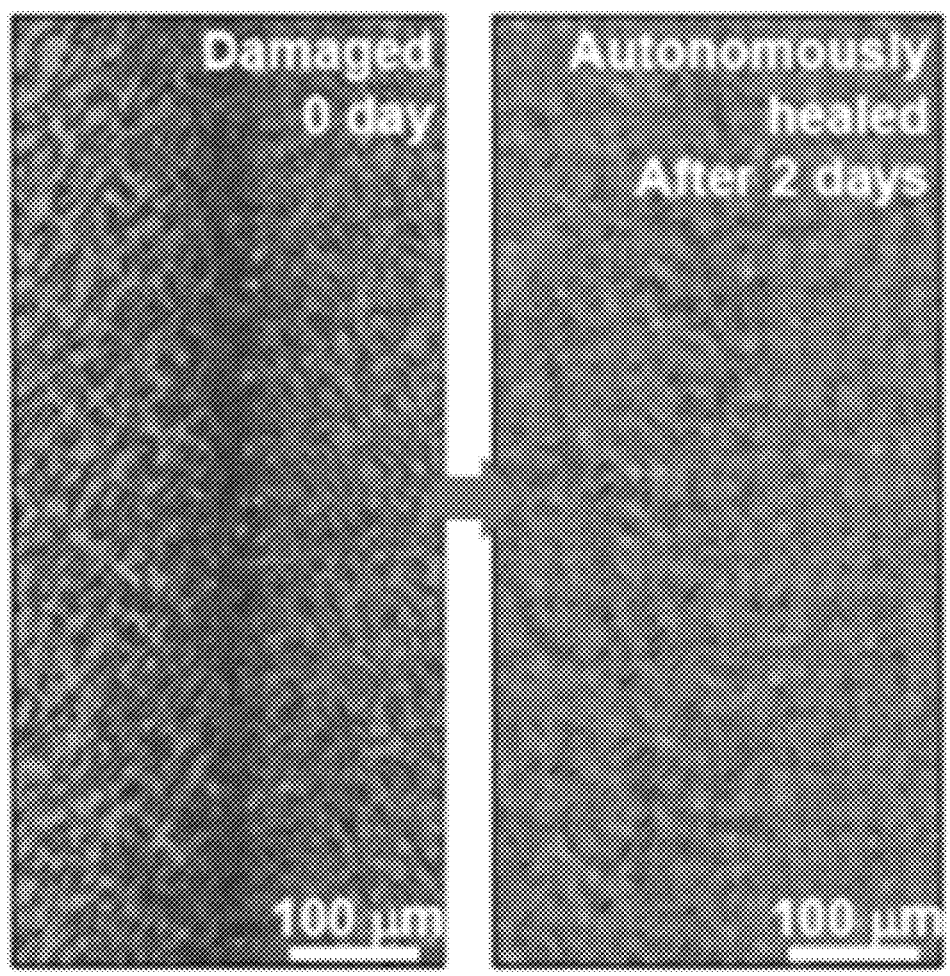
FIG. 8 is an optical microscope photograph (left) and a 2-day optical microscope photograph (right) taken after 100% stretching after cutting the self-healing conductive film according to Example 1B into two pieces.

The self-healing conductive film of Example 1B is cut into two pieces and 100% stretched and taken an optical microscope picture (left) and an optical microscope picture after 2 days (right), which are shown in FIG. 8.

Referring to FIG. 8, when the self-healing conductive film according to Example 1B is cut and then, 100% stretched, a damaged surface is observed but completely self-healed after 2 days. Accordingly, the self-healing film according to Example 1B has higher resistance against a physical damage (a mechanical damage) and thus shows improved self-healing performance at room temperature even when completely cut.

Figure 9:
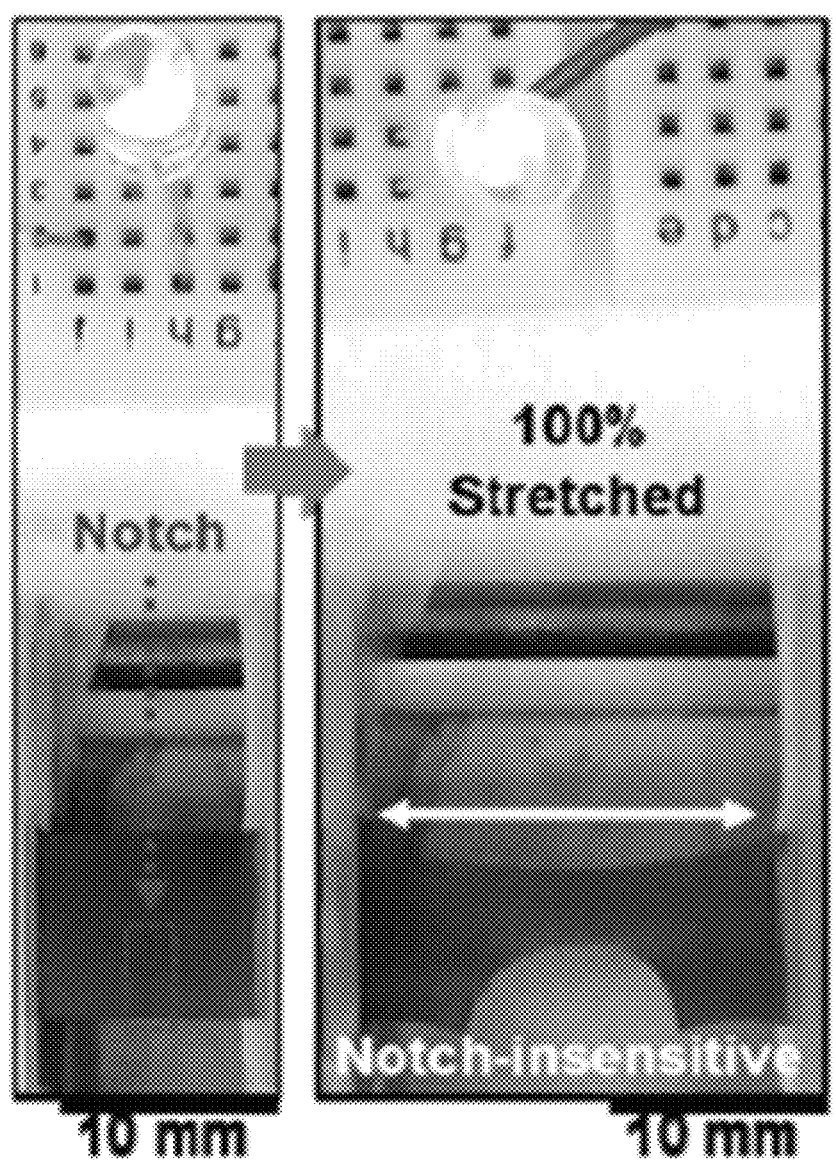
FIG. 9 shows the results of forming a notch having a diameter of 5 mm on the self-healing conductive film according to Example 1B, and then connecting the battery and the LED thereto and operating the switch.

After forming a notch having a diameter of 5 mm in the self-healing conductive film according to Example 1B and then, connecting a cell with LED, a switch is turned on. In addition, after 1200% stretching the film in which the notch is formed and then, connecting a battery cell with LED, a switch is turned on. The results are shown in FIG. 9. In FIG. 9, a left photograph shows the film after forming the notch, and a right photograph shows the film after forming the notch and being stretched. Referring to FIG. 9, the film is well recovered from damages after the notch formation and after the notch formation and the stretching.

Evaluation 2: Self-Healing Properties in Devices

LEC (a light emitting capacitor) is manufactured by disposing a light emitting film between two sheets of the self-healing conductive films according to Example 1B. The light emitting film is manufactured by adding 4 g of the elastomer according to Synthesis Example 1 to 20 mL of chloroform ($CHCl_3$) and then, 4 g of Cu-doped ZnS to the solution obtained through stirring at 50° C. to prepare a solution and then, spin-coating the solution on an OTS-treated 4-inch silicon substrate. The coated substrate is dried at room temperature (25° C.) for 6 hours and then, at 80° C. under a reduced pressure (about 100 torr) for 3 hours. The obtained light emitting film is disposed between two sheets of the self-healing conductive films according to Example 1B to manufacture LEC (pristine LEC).

Figure 10:
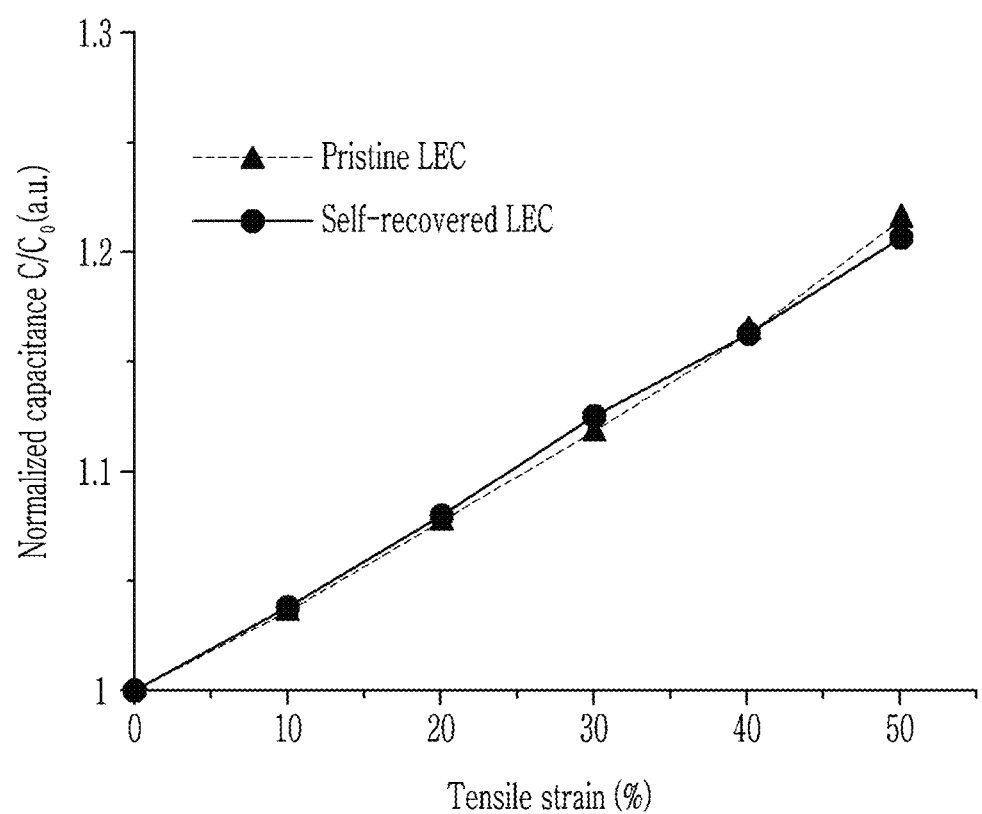
FIG. 10 is a graph showing the results of measuring the capacitance by cutting two parts on a LEC (light emitting capacitor) and damaging it by 50% stretching.

The manufactured LEC is cut at two places to do damage and 50% stretched to measure capacity (self-recovered LEC). The results are shown in FIG. 10. Capacity of 50%-stretched LEC without damage is measured and compared with the aforementioned results and shown in FIG. 10. Referring to FIG. 10, LEC shows equivalent performance after the damage to that before the damage.

Figure 11:
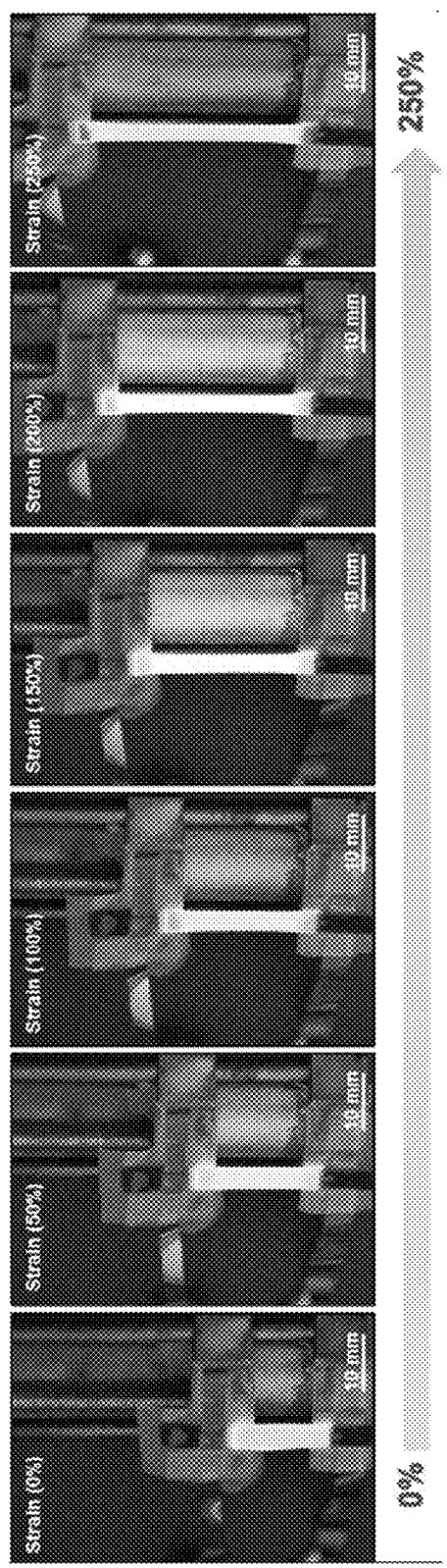
FIG. 11 is optical photographs taken while stretching after damaging the LEC including the self-healing film according to Example 1B.

The LEC was cut at two places to do damage and stretched up to 250% to examine whether or not light-emitted or not, and the results are shown in FIG. 11. FIG. 11 is optical photographs taken while stretching after damaging the LEC including the self-healing film according to Example 1B. Referring to FIG. 11, light-emitting characteristics are maintained even after the damage and then, the stretching.

Figure 12:
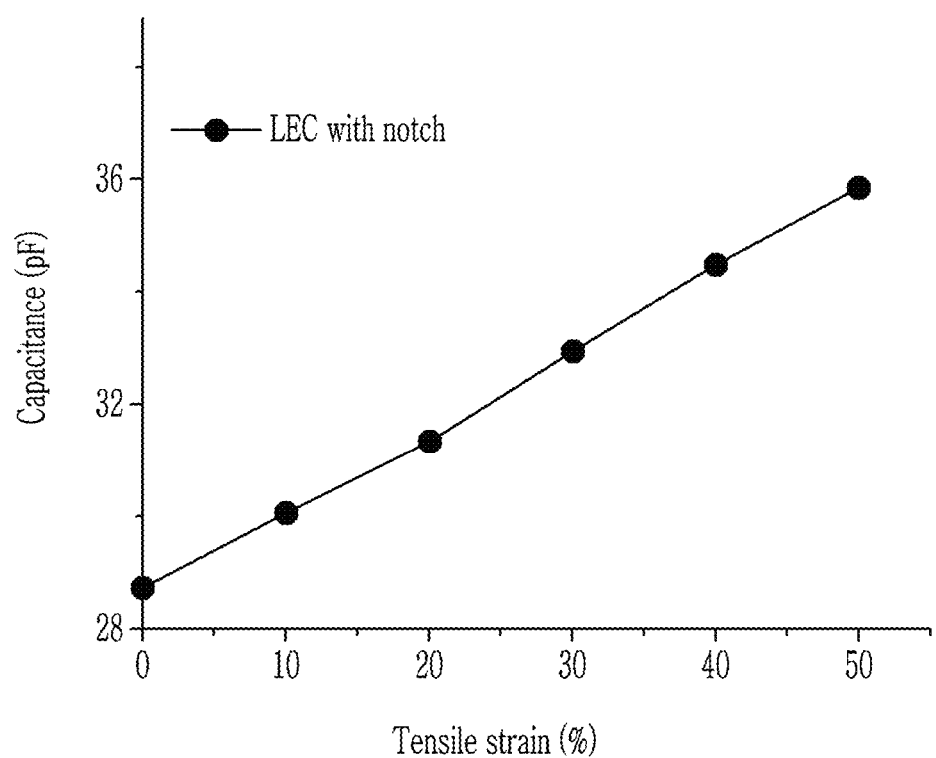
FIG. 12 is a graph showing the results of measuring the capacity by forming a notch of diameter of 2 mm in the LEC and stretching it by 50%.
Figure 13A:
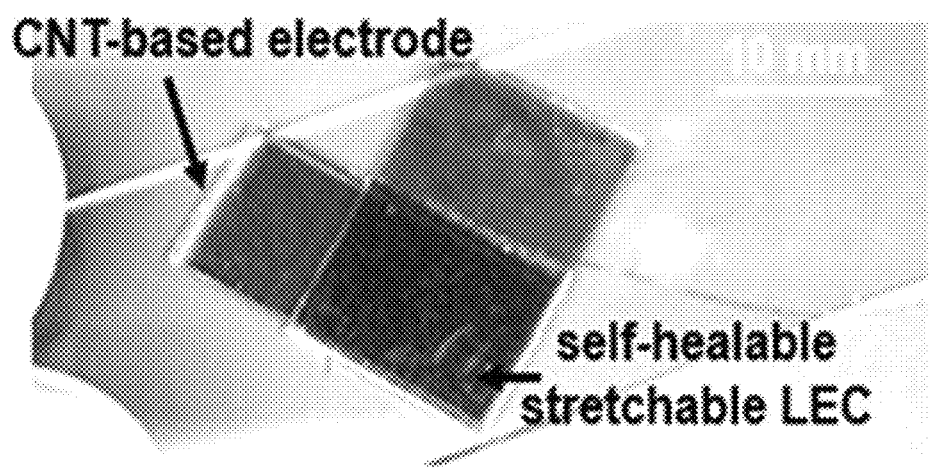
FIGS. 13A-13F show photographs showing LEC cut into two pieces and then evaluating self-healing performance.
Figure 13B:
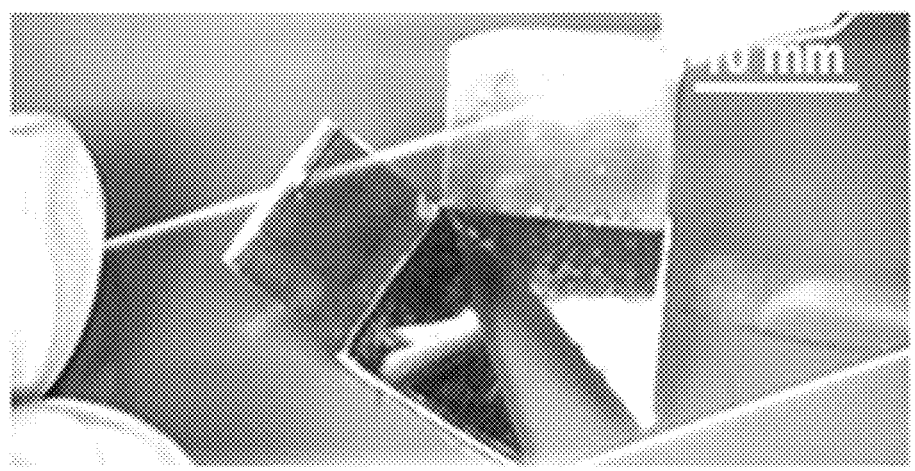
Figure 13C:
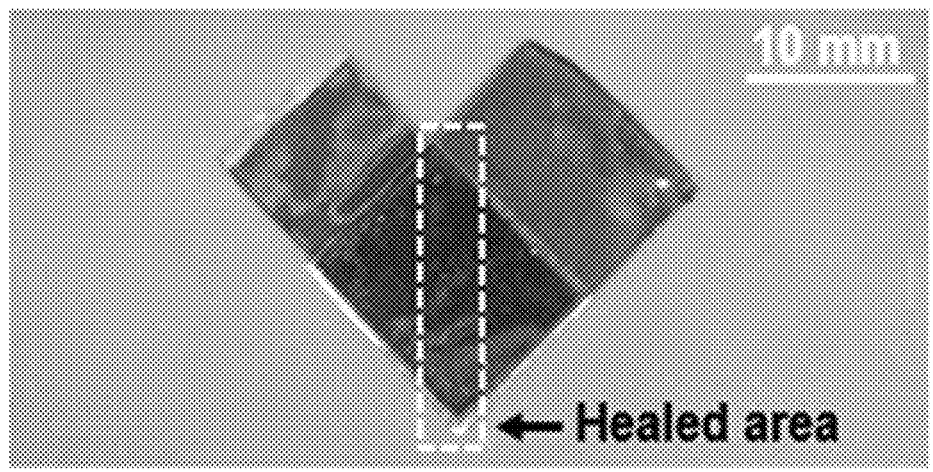
Figure 13D:
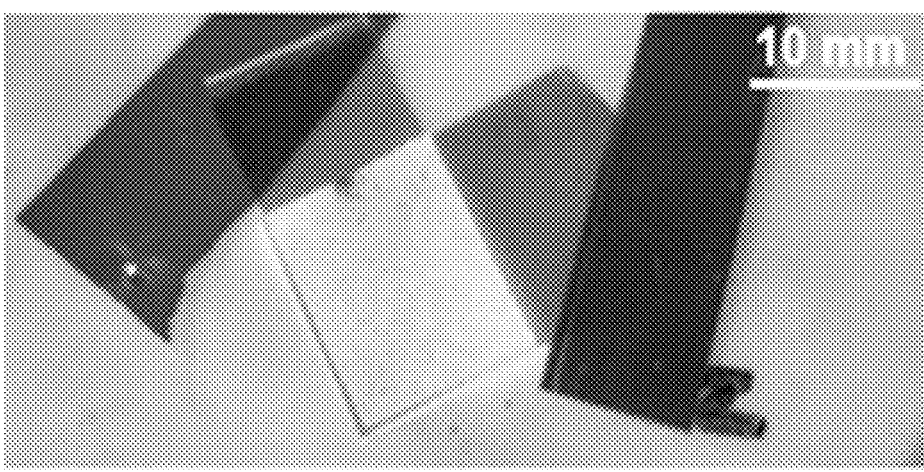
Figure 13E:
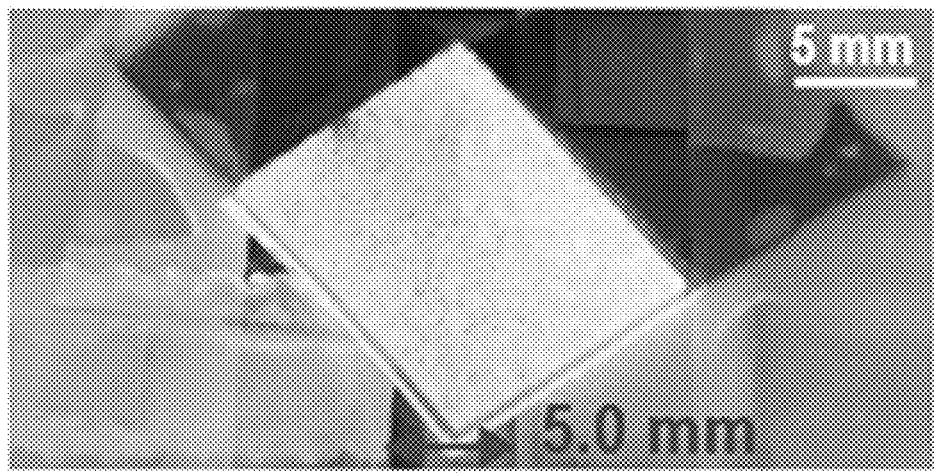
Figure 13F:
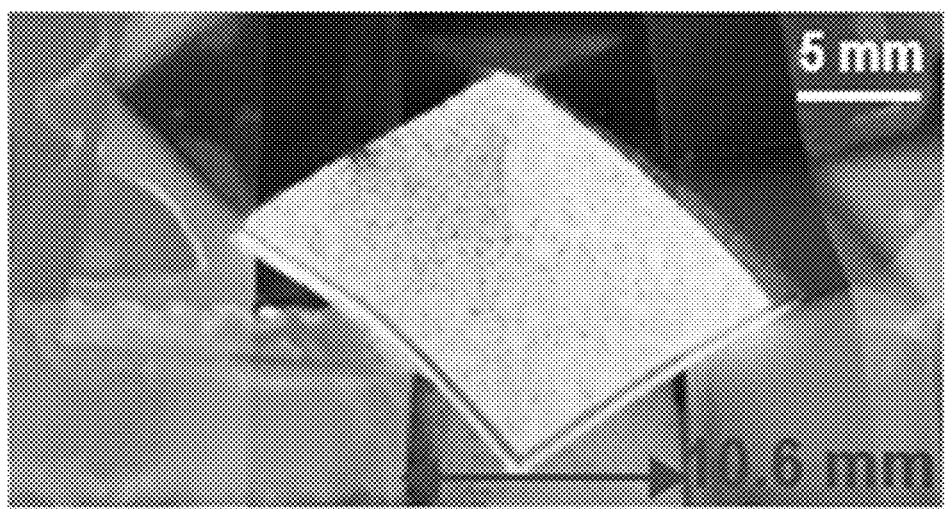

A notch having a diameter of 2 mm is formed on the manufactured LEC, and capacity thereof after 50% stretching is measured. The results are shown in FIG. 12. FIG. 12 is a graph showing the results of measuring the capacity by forming a notch of diameter of 2 mm in the LEC and stretching it by 50%. Referring to FIG. 12, improved capacity characteristics are obtained after forming the notch and the stretching.

The manufactured LEC is completely cut into 2 pieces, and self-healing performance thereof is evaluated and shown in FIGS. 13A-F. FIGS. 13A-F show photographs showing LEC cut into two pieces and then evaluating self-healing performance. Referring to FIGS. 13A-F, when LEC (FIG. 13A) is completely cut (FIG. 13B), self-healed for 24 hours (FIG. 13C), operated (FIG. 13D), stretched (FIGS. 13E and 13F), light-emitting characteristics are maintained.

Figure 14A:
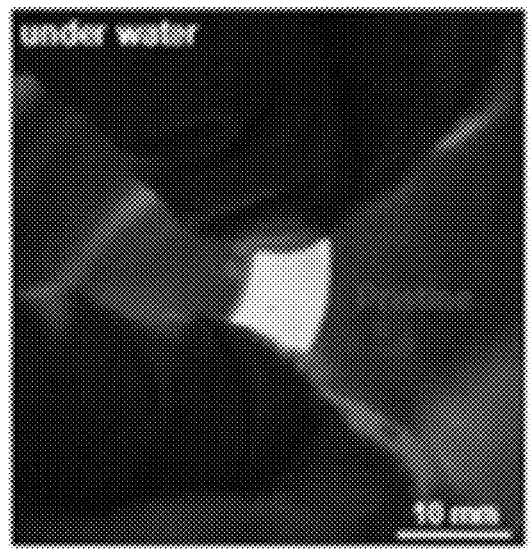
FIGS. 14A and 14B are photographs showing light-emitting characteristics evaluated by fully cutting the LEC into two pieces, then stretching the self-recovered LEC in water.
Figure 14B:
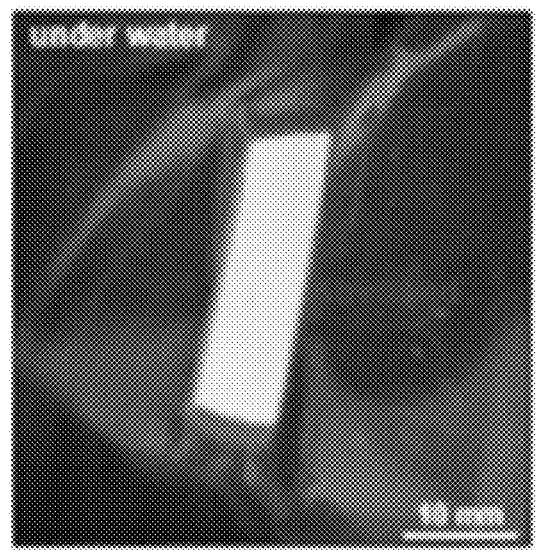

LEC is completely cut into two pieces, self-healed for 14 hours, put in water, and then, stretched to evaluate light-emitting characteristics. The results are shown in FIGS. 14A and 14B. FIGS. 14A and 14B are photographs showing light-emitting characteristics evaluated by fully cutting the LEC into two pieces, then stretching the self-recovered LEC in water. In FIGS. 14A and 14B, FIG. 14A is a photograph before stretching, and FIG. 14B is a photograph after stretching. Referring to FIG. 14A, improved light-emitting characteristics are maintained in the water, and referring to FIG. 14B, improved light-emitting characteristics are maintained even when stretched in the water. Accordingly, improved water resistant characteristics are obtained.

Figure 15:
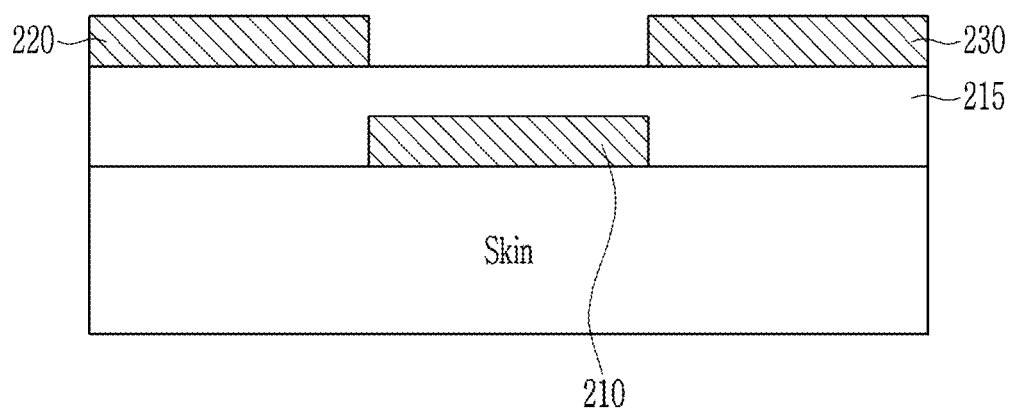
FIG. 15 is a schematic cross-sectional view showing the structure of an electrocardiogram (ECG) sensor.

In order to evaluate self-healing performance in a state of contacting a skin, the self-healing conductive film is used to manufacture an electrocardiogram (ECG) sensor. FIG. 15 is a schematic cross-sectional view showing the structure of an electrocardiogram (ECG) sensor. Referring to FIG. 15, a first electrode 210 is formed with the self-healing conductive film according to Example 5B, an insulating layer 215 is formed with the self-healing insulating film according to Example 1A, the self-healing conductive film according to Example 5B is disposed to form a second electrode 220 and a third electrode 230, and thus an electrocardiogram (ECG) sensor is manufactured.

Figure 16:
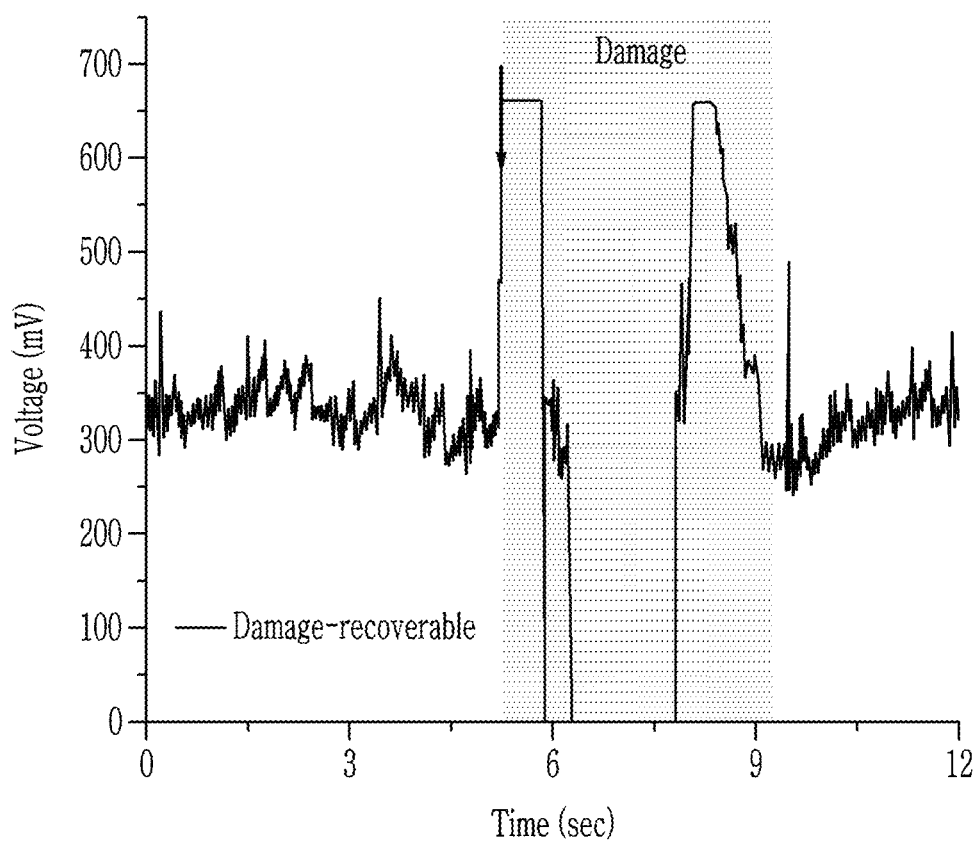
FIG. 16 is a graph showing the results of measuring the voltage over time after damaging the ECG sensor.

After attaching the manufactured ECG sensor on the skin, a voltage over time is measured. In order to evaluate the self-healing performance, the voltage over time is measured after damaging the ECG sensor. The results are shown in FIG. 16. FIG. 16 is a graph showing the results of measuring the voltage over time after damaging the ECG sensor. Referring to FIG. 16, the ECG sensor is self-healed after damage.

Figure 17:
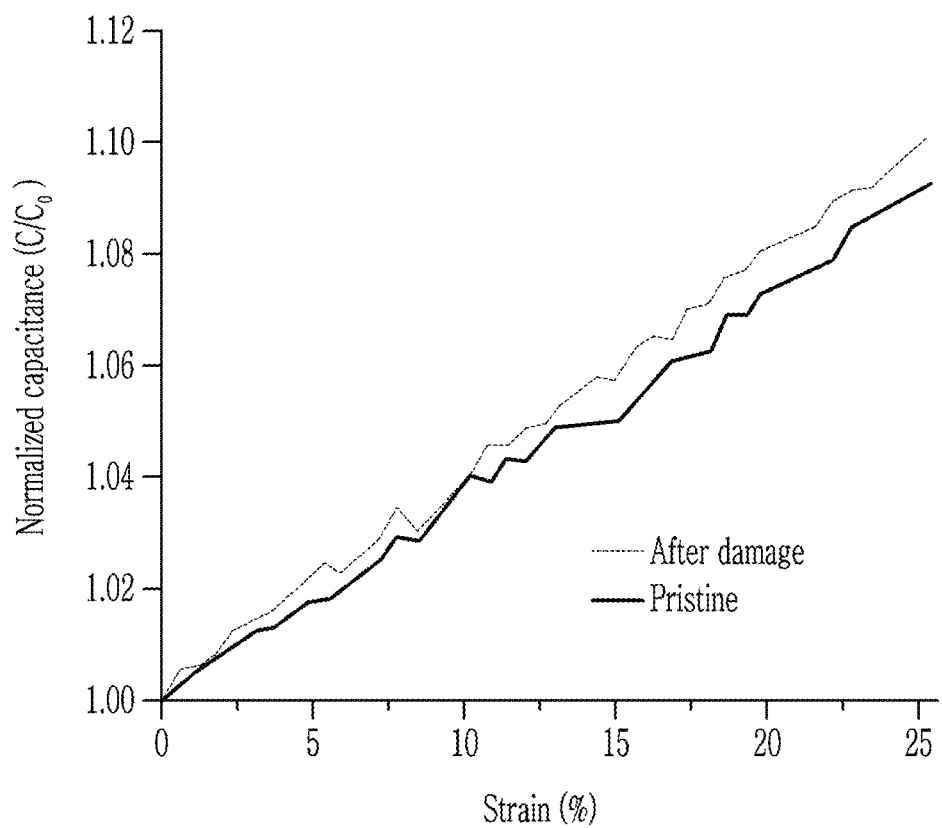
FIG. 17 is a graph showing the results of measuring the capacity according to the strain after cutting the capacitive strain sensor including the self-healing conductive film according to Example 5B to damage.

Two sheets of the self-healing conductive films according to Example 5B are disposed as an upper electrode and a lower electrode, the self-healing insulating film according to Example 1A is inserted as a dielectric material layer between the upper electrode and the lower electrode to manufacture a capacitive strain sensor. The capacitive strain sensor is cut to do damage, and then, capacity according to a strain is measured and shown in FIG. 17. Referring to FIG. 17, performance of the capacitive strain sensor after doing damage thereon is recovered.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A self-healing composite comprising
   a matrix including an elastomer, and
   conductive nanostructures embedded in the matrix
   wherein the elastomer comprises
   a polymer main chain,
   a —HN—C(=O)—NH— containing first structural unit capable of forming a cooperative hydrogen bond, and
   a —HN—C(=O)—NH— containing second structural unit capable of forming an anti-cooperative hydrogen bond.

2. The self-healing composite of claim 1, wherein the polymer main chain comprises at least one of polysiloxane, polydialkylsiloxane wherein, the alkyl is a C1 to C6 alkyl, polyethylene oxide (PEO), polypropylene oxide (PPO), polybutylene oxide (PBO), perfluoropolyether (PFPE), polyolefin, poly(ethylene-co-1-butylene), polybutadiene, hydrogenated poly(butadiene), a (poly(ethylene oxide)-poly (propylene oxide) copolymer, poly(hydroxyalkanoate), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, or a silicone rubber.

3. The self-healing composite of claim 2, wherein the polyolefin is one of polyethylene (PE), polypropylene (PP), polybutylene (PB), a copolymer thereof, or a mixture thereof.

4. The self-healing composite of claim 1, wherein the first structural unit is represented by Chemical Formula 1:

[Chemical Formula 1]

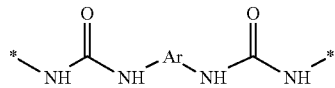

wherein, in Chemical Formula 1,
Ar is a substituted or unsubstituted C6 to C30 arylene group or C3 to C30 heteroarylene group.

5. The self-healing composite of claim 4, wherein the arylene group is a single aromatic ring group; a condensed group including two or more fused aromatic ring groups; or an aromatic ring group including two or more aromatic ring groups linked by a functional group of a single bond, a fluorenylene group, a C1 to C10 cycloalkylene group, —O—, —S—, —C(=O)—, —CH(OH)—, —S(=O)$_2$—, —Si(CH$_3$)$_2$—, —(CH$_2$)$_p$— (wherein, 1≤p≤10), —(CF$_2$)$_q$— (wherein, 1≤q≤10), —C(CH$_3$)$_2$—, —C(CF$_3$)$_2$—, —C(=O)NH—, or a combination thereof.

6. The self-healing composite of claim 5, wherein in Chemical Formula 1, —Ar— is represented by Chemical Formula 1A:

[Chemical Formula 1A]

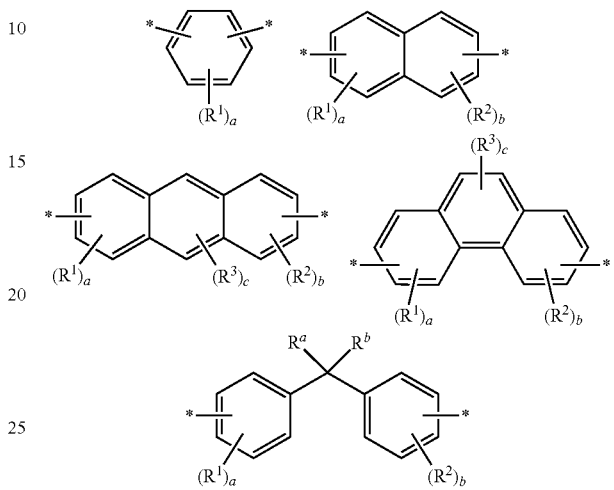

wherein, in Chemical Formula 1A,
R$^1$ to R$^3$ are independently hydrogen or a C1 to C6 alkyl group, a, b, and c are the same as the number of hydrogen bound to the aromatic rings, and
R$^a$ and R$^b$ are independently hydrogen, a halogen, a C1 to C6 alkyl group, or a C1 to C6 fluoroalkyl group.

7. The self-healing composite of claim 5, wherein in Chemical Formula 1, —Ar— is represented by Chemical Formula 1B:

[Chemical Formula 1B]

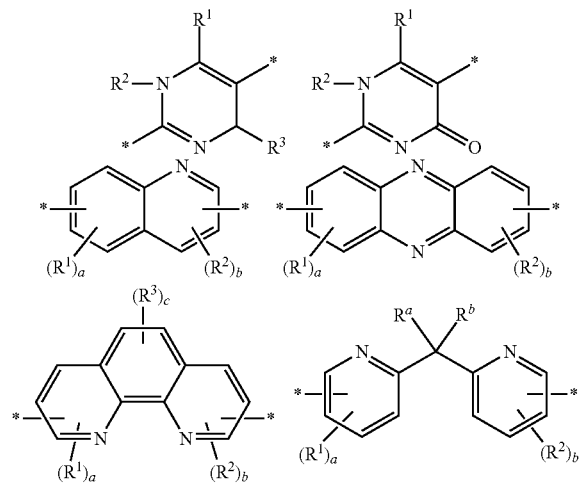

wherein, in Chemical Formula 1B,
R$^1$ to R$^3$ are independently hydrogen or a C1 to C6 alkyl group, a, b, and c are the same as the number of hydrogen bound to the aromatic rings, and
R$^a$ and R$^b$ are independently hydrogen, a halogen, a C1 to C6 alkyl group, or a C1 to C6 fluoroalkyl group.

8. The self-healing composite of claim 5, wherein the second structural unit is represented by Chemical Formula 2-1 or Chemical Formula 2-2:

[Chemical Formula 2-1]

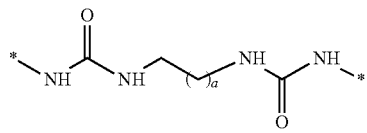

wherein, in Chemical Formula 2-1,
a is an integer ranging from 5 to 20, and

[Chemical Formula 2-2]

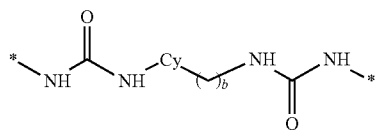

wherein, in Chemical Formula 2-2,
Cy is a substituted or unsubstituted C5 to C30 cycloalkylene group, and
b is an integer of 1 or 3.

9. The self-healing composite of claim 5, wherein the second structural unit is represented by Chemical Formula 2-2:

[Chemical Formula 2-2]

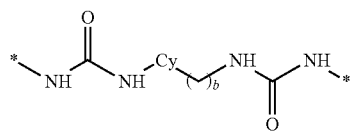

wherein, in Chemical Formula 2-2,
Cy is a substituted or unsubstituted C5 to C30 cycloalkylene group, and
b is an integer of 1 or 3.

10. The self-healing composite of claim 9, wherein Cy of Chemical Formula 2-2 is represented by Chemical Formula 2-2A, Chemical Formula 2-2B, or Chemical Formula 2-2C:

[Chemical Formula 2-2A]

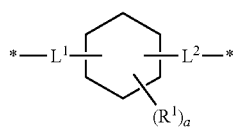

wherein, in Chemical Formula 2-2A,
$R^1$ is hydrogen or a C1 to C6 alkyl group and a is the same as the number of hydrogen bound to the cyclohexyl ring, and
$L^1$ and $L^2$ are independently a single bond or a substituted or unsubstituted C1 to C10 alkylene group,

[Chemical Formula 2-2B]

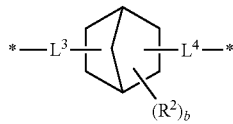

wherein, in Chemical Formula 2-2B,
$R^2$ is hydrogen or a C 1 to C6 alkyl group and b is the same as the number of hydrogen bound to the cyclohexyl ring, and
$L^3$ and $L^4$ are independently a single bond or a substituted or unsubstituted C1 to C10 alkylene group,

[Chemical Formula 2-2C]

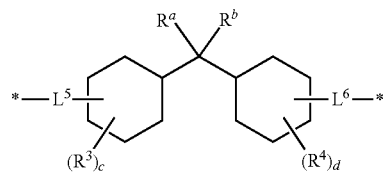

wherein, in Chemical Formula 2-2C,
$R^3$ and $R^4$ are independently hydrogen or a C1 to C6 alkyl group, c and d are independently the same as the number of hydrogen bound to the cyclohexyl ring,
$R^a$ and $R^b$ are independently hydrogen, a halogen, a C1 to C6 alkyl group, or a C1 to C6 fluoroalkyl group, and
$L^5$ and $L^6$ are independently a single bond or a substituted or unsubstituted C1 to C10 alkylene group.

11. The self-healing composite of claim 4, wherein in Chemical Formula 1, —Ar— is an aromatic ring group selected from a substituted or unsubstituted phenylene, a substituted or unsubstituted naphthalene, a substituted or unsubstituted anthracene, a substituted or unsubstituted phenanthrene, a substituted or unsubstituted pyrene, a substituted or unsubstituted perylene, a substituted or unsubstituted fluorene, a substituted or unsubstituted pentalene, a substituted or unsubstituted pyrazole, a substituted or unsubstituted imidazole, a substituted or unsubstituted thiazole, a substituted or unsubstituted triazole, a substituted or unsubstituted carbazole, a substituted or unsubstituted pyridine, a substituted or unsubstituted pyridazine, a substituted or unsubstituted pyrimidine, a substituted or unsubstituted pyrazine, a substituted or unsubstituted triazine, a substituted or unsubstituted indazole, a substituted or unsubstituted indolizine, a substituted or unsubstituted benzimidazole, a substituted or unsubstituted benzthiazole, a substituted or unsubstituted thienothiophene, a substituted or unsubstituted benzothiophene, a substituted or unsubstituted benzopurine, a substituted or unsubstituted isoquinoline, and a substituted or unsubstituted purine, or an aromatic ring group including two or more of the foregoing aromatic ring groups are linked by a linker.

12. The self-healing composite of claim 1, wherein the first structural unit and the second structural unit are included in a mole ratio of about 0.2:0.8 to about 0.5:0.5.

13. The self-healing composite of claim 1, wherein each of the first structural unit and the second structural unit is included in an amount of about 0.01 mmol to about 10 mmol based on 1 mol of the elastomer.

14. The self-healing composite of claim 1, wherein the polymer main chain is derived from a polymer having a low glass transition temperature.

15. The self-healing composite of claim 14, wherein the polymer has a glass transition temperature of about −40° C. to about 40° C.

16. The self-healing composite of claim 1, wherein the elastomer has a number average molecular weight (Mn) of about 10,000 to about 100,000.

17. The self-healing composite of claim 1, wherein the conductive nanostructures comprise carbon nanotubes (CNT), carbon nanofibrils (CNF), carbon nanowalls (CNW), graphenes (or other two-dimensional (2D) materials), carbon nanotubes (CNT) doped with nanometals, carbon nanofibrils doped with nanometals, carbon nanowalls doped with nanometals, graphenes (or other two-dimensional (2D) materials) doped with nanometals, nanometals, conductive metal oxides, or a combination thereof.

18. The self-healing composite of claim 1, wherein the conductive nanostructures have a diameter of less than or equal to about 100 nm.

19. The self-healing composite of claim 1, wherein the conductive nanostructures are included in an amount of about 0.05 to about 50 parts by weight based on 100 parts by weight of the elastomer.

20. The self-healing composite of claim 1, wherein the self-healing composite has a film shape.

21. A device comprising the self-healing composite of claim 1.

22. The device of claim 21, wherein the device is a thin film transistor, a light emitting capacitor, an electronic skin, a sensor, a foldable device, or a stretchable device.

23. A method of manufacturing a self-healing composite comprising preparing a composition by dispersing an elastomer and conductive nanostructures in a solvent, wherein the elastomer comprises a polymer main chain, a —HN—C(=O)—NH— containing first structural unit capable of forming a cooperative hydrogen bond, and a —HN—C(=O)—NH— containing second structural unit capable of forming an anti-cooperative hydrogen bond, applying the composition on a substrate, and removing the solvent to form the composite of claim 1.

* * * * *

UNITED STATES PATENT AND TRADEMARK OFFICE
CERTIFICATE OF CORRECTION

Page 1 of 1

PATENT NO. : 10,899,908 B2
APPLICATION NO. : 16/458429
DATED : January 26, 2021
INVENTOR(S) : Youngjun Yun et al.

It is certified that error appears in the above-identified patent and that said Letters Patent is hereby corrected as shown below:

On the Title Page

At item (73):
"The Roam Of Trustees Of The Leland Stanford Junior University, Stanford, CA (US)" should read -- The Board Of Trustees Of The Leland Stanford Junior University, Stanford, CA (US) --

Signed and Sealed this
Sixth Day of April, 2021

Drew Hirshfeld
*Performing the Functions and Duties of the
Under Secretary of Commerce for Intellectual Property and
Director of the United States Patent and Trademark Office*